(12) United States Patent
Yeh et al.

(10) Patent No.: US 10,079,267 B1
(45) Date of Patent: Sep. 18, 2018

(54) MEMORY DEVICE CONTAINING WRAP GATE VERTICAL SELECT TRANSISTORS AND METHOD OF MAKING THEREOF

(71) Applicant: SANDISK TECHNOLOGIES LLC, Plano, TX (US)

(72) Inventors: Chao Feng Yeh, Yokkaichi (JP); Tian Chen Dong, Yokkaichi (JP)

(73) Assignee: SANDISK TECHNOLOGIES LLC, Addison, TX (US)

( * ) Notice: Subject to any disclaimer, the term of this patent is extended or adjusted under 35 U.S.C. 154(b) by 0 days.

(21) Appl. No.: 15/632,773

(22) Filed: Jun. 26, 2017

(51) Int. Cl.
*H01L 29/06* (2006.01)
*H01L 27/24* (2006.01)
*H01L 45/00* (2006.01)

(52) U.S. Cl.
CPC ........ *H01L 27/2454* (2013.01); *H01L 27/249* (2013.01); *H01L 45/16* (2013.01)

(58) Field of Classification Search
CPC . H01L 23/535; H01L 27/115; H01L 27/2454; H01L 27/249; H01L 29/42392; H01L 29/66666; H01L 29/66742; H01L 29/78642; H01L 45/1226; H01L 45/142; H01L 45/143; H01L 45/146; H01L 45/147; H01L 45/149; H01L 45/01
USPC .............................................. 257/5, 314–329
See application file for complete search history.

(56) References Cited

U.S. PATENT DOCUMENTS

| | | | |
|---|---|---|---|
| 5,915,167 A | 6/1999 | Leedy | |
| 7,701,746 B2 | 4/2010 | Meeks et al. | |
| 7,764,534 B2 | 7/2010 | Thorp et al. | |
| 9,331,088 B2 | 5/2016 | Takaki | |
| 9,343,507 B2 | 5/2016 | Takaki | |
| 9,437,658 B2 | 9/2016 | Sakotsubo | |
| 9,443,910 B1* | 9/2016 | Fujiwara | H01L 27/2481 |
| 2013/0043455 A1 | 2/2013 | Bateman | |
| 2014/0252454 A1* | 9/2014 | Rabkin | H01L 27/249 257/329 |
| 2017/0141161 A1 | 5/2017 | Sakotsubo | |

FOREIGN PATENT DOCUMENTS

WO    WO2007004843 A1    1/2007

OTHER PUBLICATIONS

Endoh et al., "Novel Ultra High Density Memory with a Stacked-Surrounding Gate Transistor (S-SGT) Structured Cell," IEDM Proc., (2001), 33-36.

* cited by examiner

*Primary Examiner* — Brook Kebede
(74) *Attorney, Agent, or Firm* — The Marbury Law Group PLLC

(57) ABSTRACT

A gate dielectric layer and a gate electrode layer are formed around semiconductor pillars. The gate electrode layer is patterned to remove top portions that protrude above the semiconductor pillars and divided into multiple strips. Each strip constitutes a gate electrode line including a horizontal layer portion and a plurality of surrounding portions that entirely laterally surround respective channel regions of the semiconductor pillars to form wrap gate vertical select field effect transistors. Vertical stacks of memory elements and alternating layer stacks including a vertically alternating sequence of insulating strips and electrically conductive word line strips are formed above the vertical field effect transistors. Vertical bit lines can be formed inside the vertical stacks of memory elements.

9 Claims, 26 Drawing Sheets

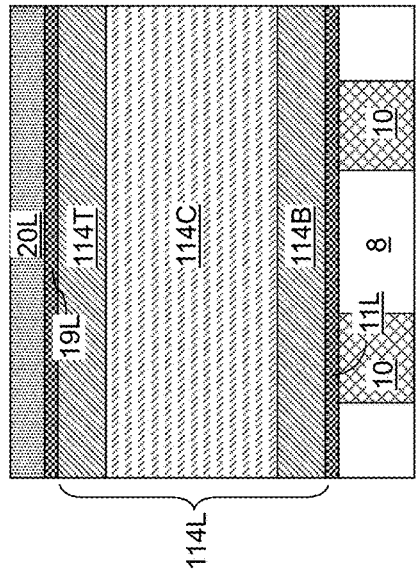
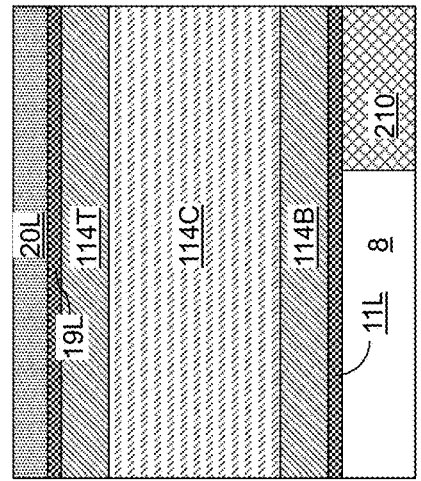
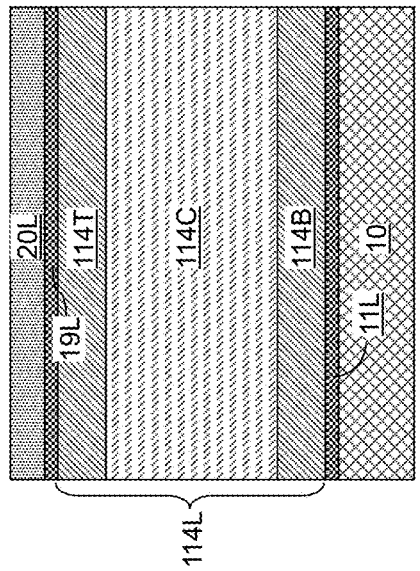
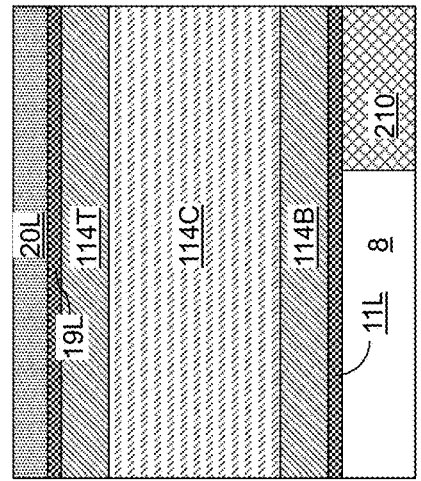

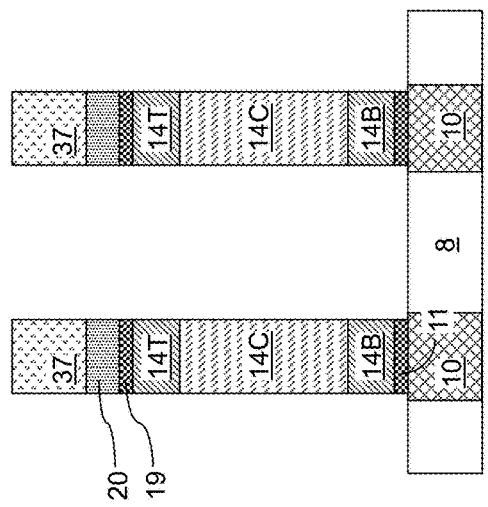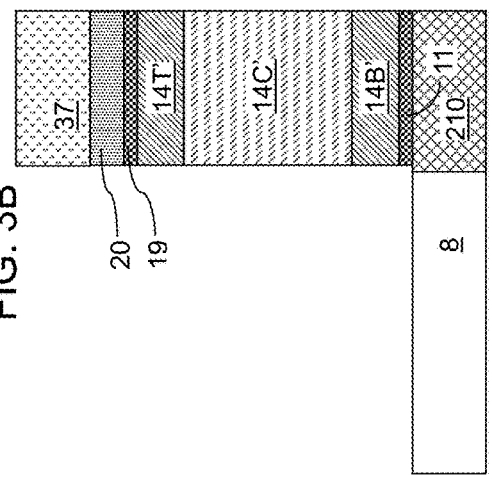

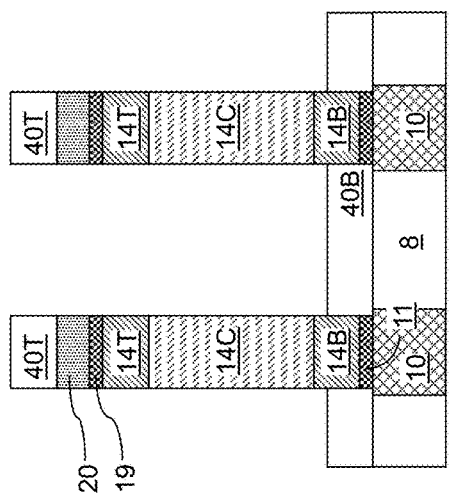
FIG. 4A
FIG. 4B
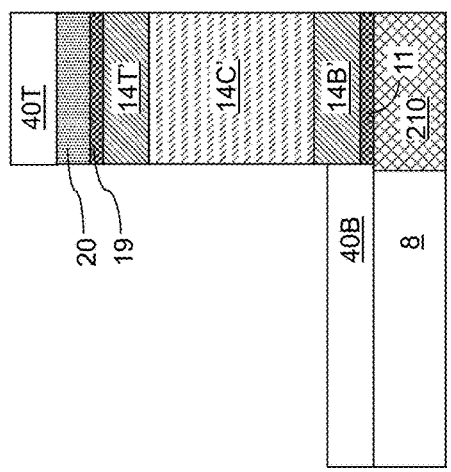
FIG. 4D
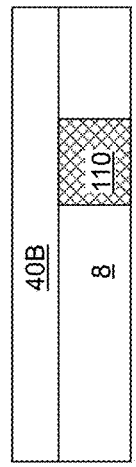
FIG. 4C

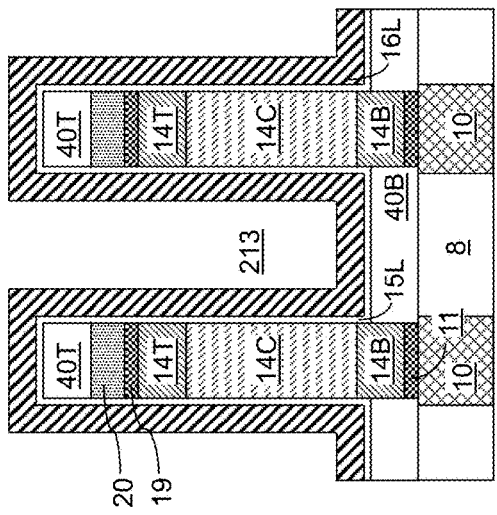
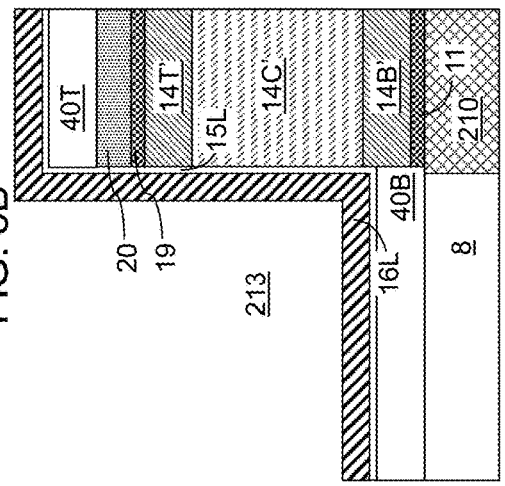
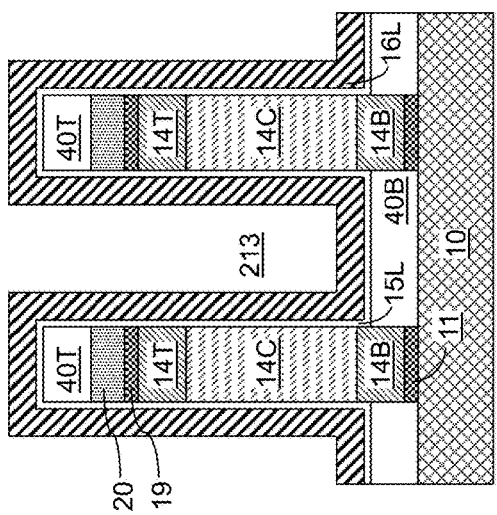
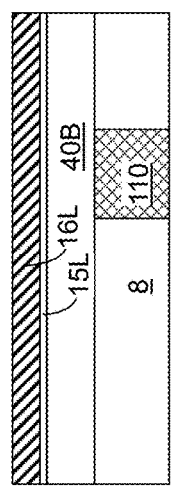

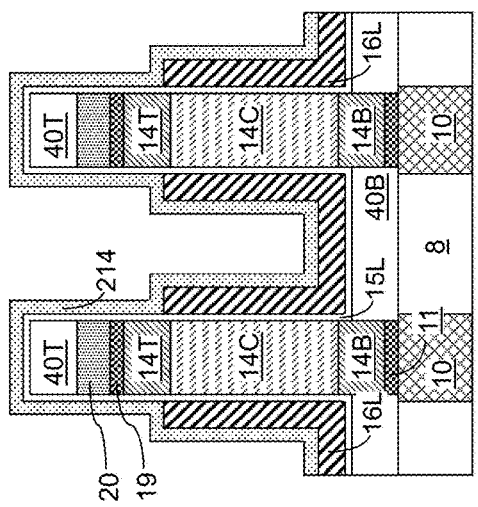
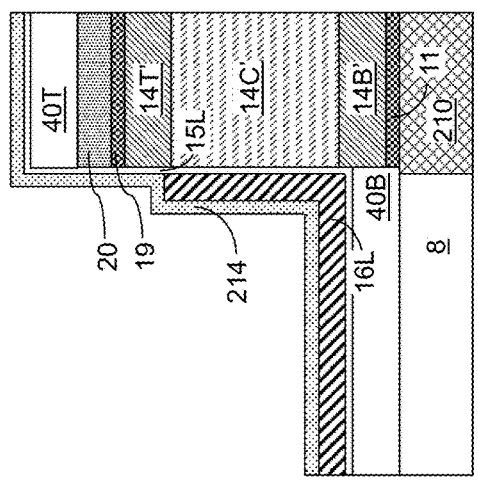
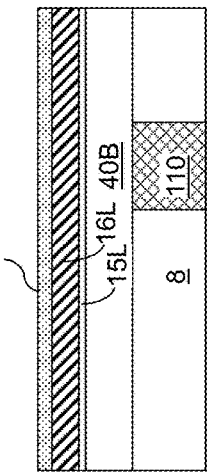
FIG. 7A
FIG. 7B
FIG. 7C
FIG. 7D

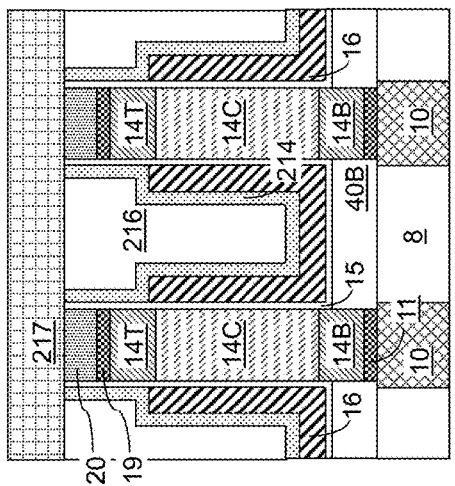
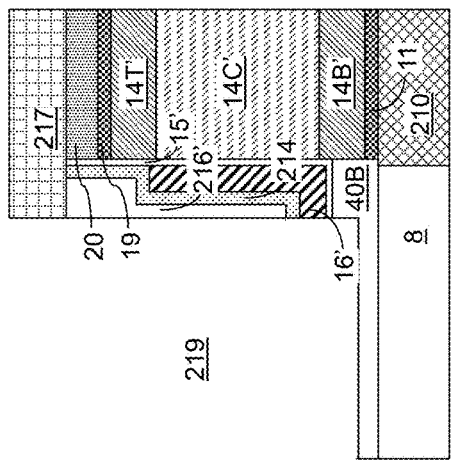
FIG. 9A
FIG. 9B
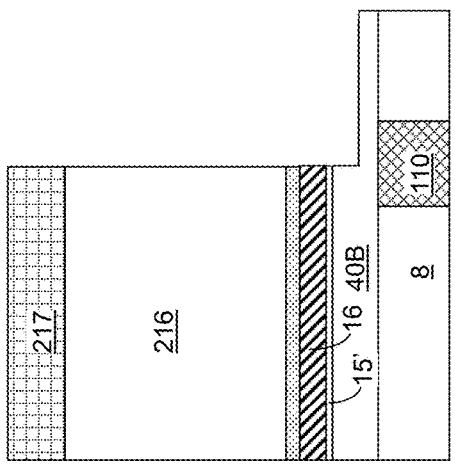
FIG. 9C
FIG. 9D

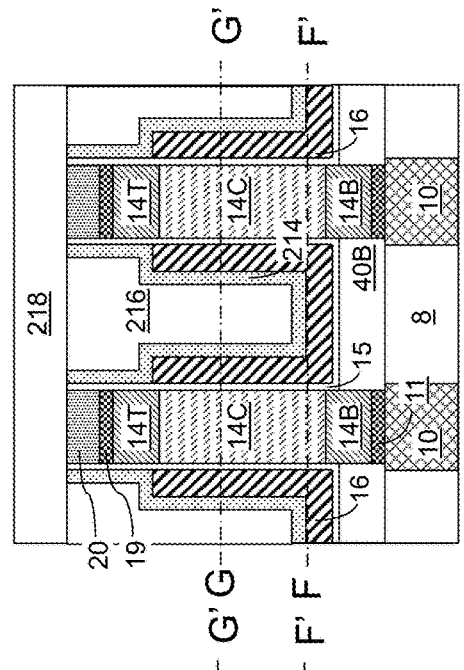
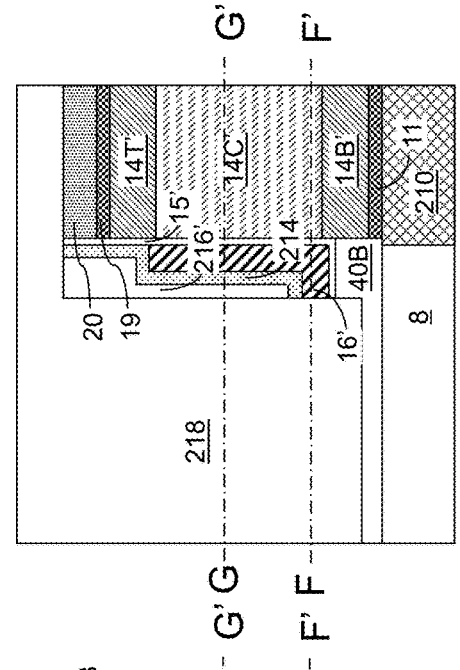
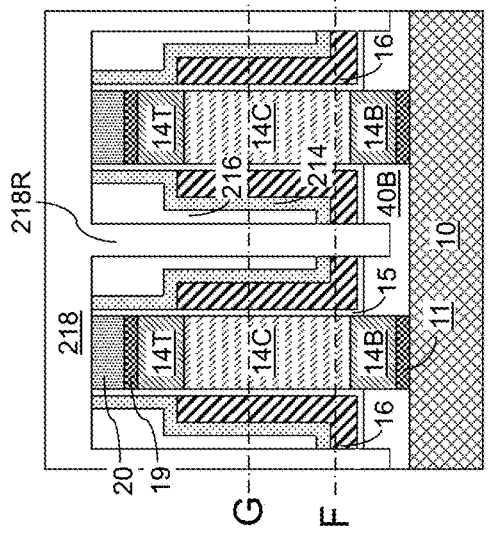
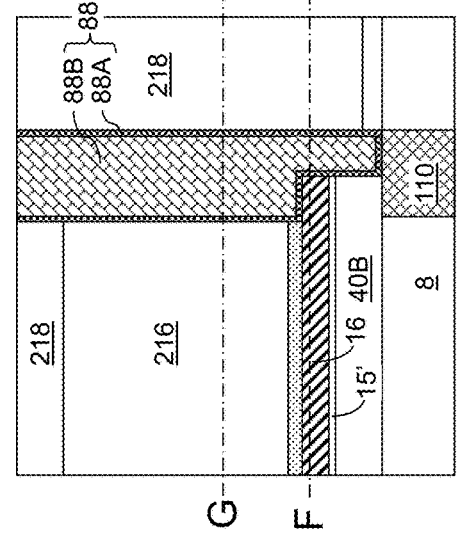
FIG. 11A
FIG. 11B
FIG. 11C
FIG. 11D

MEMORY DEVICE CONTAINING WRAP GATE VERTICAL SELECT TRANSISTORS AND METHOD OF MAKING THEREOF

FIELD

The present disclosure relates generally to the field of semiconductor devices and specifically to three-dimensional resistive random access memory (ReRAM) devices containing vertical select gate transistors having a wrap around gate electrode and methods of making the same.

BACKGROUND

Resistive Random Access Memory, or "ReRAM," is a non-volatile memory device employing reversible change in resistance in a thin film with application of electrical voltage bias across the film. Thus, data can be stored in a ReRAM cell by changing the resistance of the thin film, which can be a solid-state material. The thin film is referred to as a memory film or a read/write film. Examples of ReRAM devices are described in World Intellectual Property Organization (WIPO) Publication No. WO2007004843 A1 to Hong et al. and U.S. Patent Application Publication No. 2013/0043455 A1 to Bateman.

A resistive memory cell can be programmed into a set state having a low electrical resistance, or a reset state having a high resistance. A write operation stores data in a set of resistive memory cells by programming each resistive memory cell into a set state or a reset state depending on the contents of the data. For example, "1" can correspond to a set state and "0" can correspond to a reset state, or vice versa.

SUMMARY

According to an aspect of the present disclosure, a memory device comprises a two-dimensional array of vertical field effect transistors located over a substrate and including a two-dimensional array of semiconductor pillars, gate electrode lines laterally extending along a first horizontal direction and spaced apart along a second horizontal direction, and gate dielectrics located between the gate electrode lines and the two-dimensional array of semiconductor pillars. Each of the semiconductor pillars comprises a bottom active region, a channel region, and a top active region. Each of the gate electrode lines comprises a plurality of surrounding portions that entirely laterally surround a respective one of the channel regions. A two-dimensional array of vertical bit lines is electrically connected to a respective one of the top active regions. Alternating layer stacks are located between neighboring rows of the vertical bit lines, wherein each of the alternating layer stacks comprises a vertically alternating sequence of insulating strips and electrically conductive word line strips. A vertical stack of memory elements is located between each of the vertical bit lines and alternating layer stacks to provide a three-dimensional memory element array.

According to another aspect of the present disclosure, a method of forming a memory device is provided, which comprises the steps of: forming a two-dimensional array of semiconductor pillars over a substrate, wherein each of the semiconductor pillars comprises a bottom active region, a channel region, and a top active region; forming a gate dielectric layer on the semiconductor pillars; forming gate electrode lines over the gate dielectric layer, wherein each of the gate electrode lines comprises a horizontal layer portion adjoined to a plurality of surrounding portions that entirely laterally surround a respective one of the channel regions; forming alternating layer stacks over the two-dimensional array of semiconductor pillars, wherein each of the alternating layer stacks comprises a vertically alternating sequence of insulating strips and electrically conductive word line strips; forming vertical stacks of memory elements between neighboring pairs of alternating layer stacks to provide a three-dimensional memory element array; and forming vertical bit lines inside the vertical stacks of memory elements, wherein each of the vertical bit lines is electrically connected to a respective one of the top active regions.

BRIEF DESCRIPTION OF THE DRAWINGS

In the various drawings of the instant disclosure, a set of drawings having a same numeric figure index (such as 1, 2, 3, etc.) and different alphabetical suffixes (such as A, B, C, D, and E) correspond to a same processing step. Alphabetical suffixes of A, B, C, and D correspond to vertical cross-sectional views along vertical cross-sectional planes A-A', B-B', C-C', and D-D', respectively, which may be shown in a top-down view having the same numeric figure index and having the alphabetical suffix E, or may correspond to a respective vertical cross-sectional plane shown in other top-down views having the alphabetical index E.

FIGS. 2A-2D are various views of the exemplary structure after formation of a planar layer stack including a bottom semiconductor layer, a channel semiconductor layer, a top semiconductor layer, a metal nitride layer, and a hard mask layer according to an embodiment of the present disclosure.

FIGS. 3A-3E are various views of the exemplary structure after patterning the planar layer stack into a two-dimensional array of semiconductor pillars according to an embodiment of the present disclosure.

FIGS. 4A-4E are various views of the exemplary structure after formation of an isolation dielectric layer according to an embodiment of the present disclosure.

FIGS. 5A-5E are various views of the exemplary structure after formation of a gate dielectric layer and a gate electrode layer according to an embodiment of the present disclosure.

FIGS. 7A-7D are various views of the exemplary structure after formation of a dielectric liner according to an embodiment of the present disclosure.

FIGS. 9A-9E are various views of the exemplary structure after patterning the dielectric fill material layer, the gate electrode layer, and the gate dielectric layer according to an embodiment of the present disclosure.

FIGS. 11A-11E are various views of the exemplary structure after deposition of a planarization dielectric layer and formation of gate contact via structures according to an embodiment of the present disclosure.

DETAILED DESCRIPTION

Figure 1A:
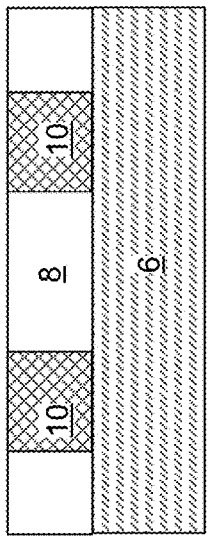
FIGS. 1A-1E are various views of an exemplary structure after formation of global bit lines embedded within an insulating matrix layer according to an embodiment of the present disclosure.
Figure 1B:
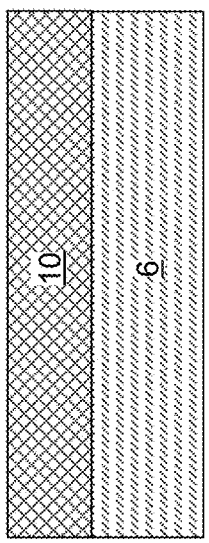
Figure 1C:
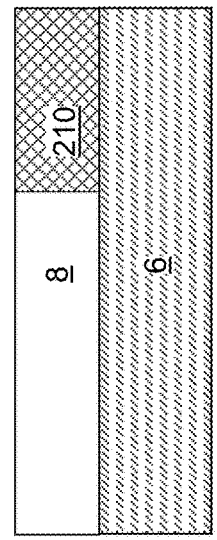
Figure 1D:
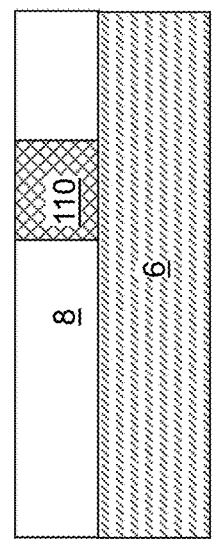
Figure 1E:
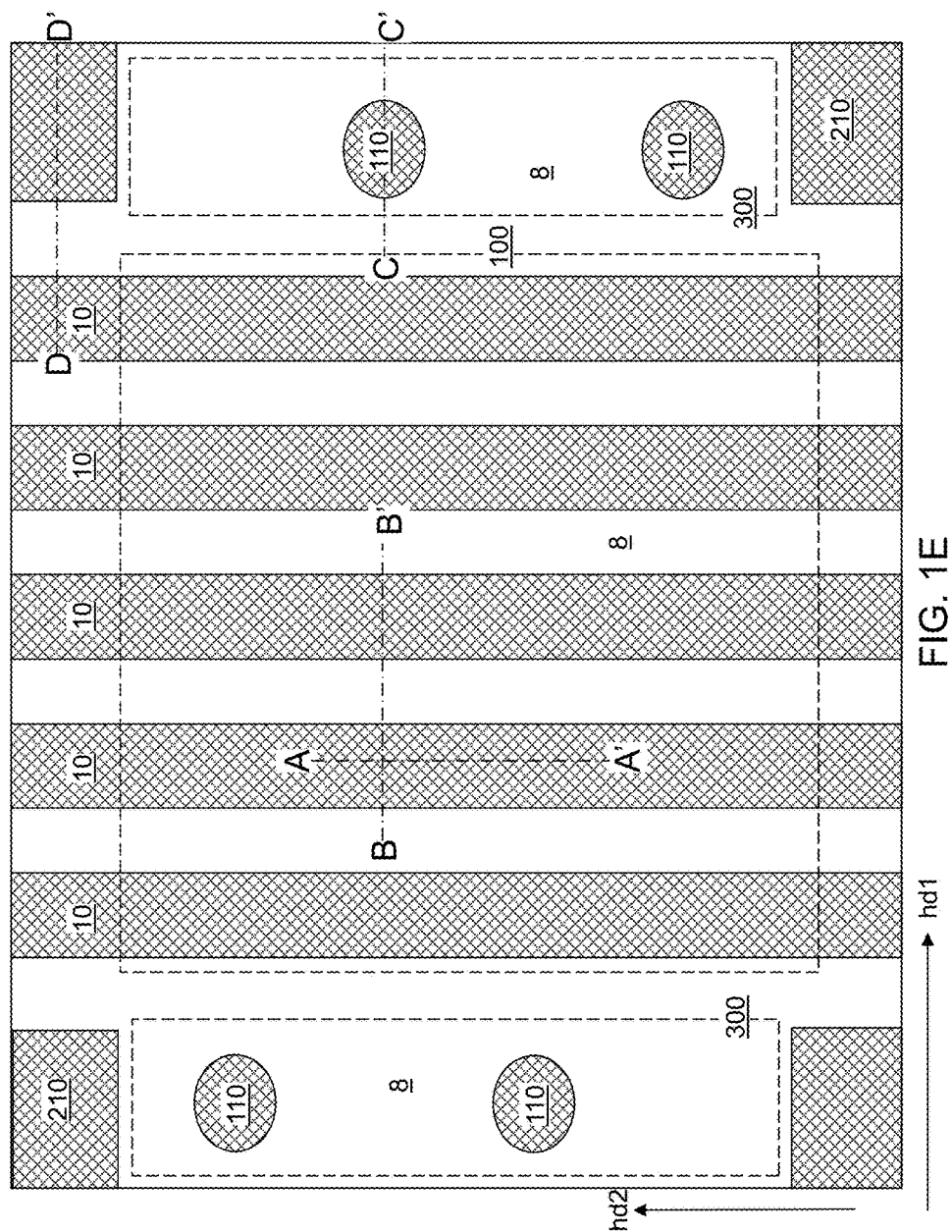

Resistive memory cells of a ReRAM memory device can be arranged in a three-dimensional array that is accessed by a two-dimensional array of vertical bit lines. A two-dimensional array of vertical select field effect transistors can be connected to the two-dimensional array of vertical bit lines to access the resistive memory cells. The vertical select field effect transistors should have well-controlled current-voltage characteristics to provide uniform and reliable switching characteristics.

The present inventors realized that conventional vertical select field effect transistors may contain suboptimum on current and contact RC between the select gate electrode and a respective zia due to the configuration of the select gate electrode. In one embodiment of the present disclosure, the vertical select field effect transistor contains a wrap around (i.e., "all surrounding") select gate electrode which surrounds the entire channel. This configuration can improve the on current of the transistor and reduce the contact RC between the select gate electrode and the respective zia.

As discussed above, the present disclosure is directed to a three-dimensional resistive random access memory (ReRAM) devices and other three-dimensional devices, and methods of making the same, the various aspects of which are described below. The embodiments of the disclosure can be employed to form various semiconductor devices such as three-dimensional monolithic memory array devices comprising ReRAM devices. The drawings are not drawn to scale. Multiple instances of an element may be duplicated where a single instance of the element is illustrated, unless absence of duplication of elements is expressly described or clearly indicated otherwise. Ordinals such as "first," "second," and "third" are employed merely to identify similar elements, and different ordinals may be employed across the specification and the claims of the instant disclosure.

As used herein, a "layer" refers to a material portion including a region having a thickness. A layer may extend over the entirety of an underlying or overlying structure, or may have an extent less than the extent of an underlying or overlying structure. Further, a layer may be a region of a homogeneous or inhomogeneous continuous structure that has a thickness less than the thickness of the continuous structure. For example, a layer may be located between any pair of horizontal planes between, or at, a top surface and a bottom surface of the continuous structure. A layer may extend horizontally, vertically, and/or along a tapered surface. A substrate may be a layer, may include one or more layers therein, and/or may have one or more layer thereupon, thereabove, and/or therebelow.

As used herein, a "layer stack" refers to a stack of layers. As used herein, a "line" or a "line structure" refers to a layer that has a predominant direction of extension, i.e., having a direction along which the layer extends the most.

As used herein, a "field effect transistor" refers to any semiconductor device having a semiconductor channel through which electrical current flows with a current density modulated by an external electrical field. As used herein, an "active region" refers to a source region of a field effect transistor or a drain region of a field effect transistor. A "top active region" refers to an active region of a field effect transistor that is located above another active region of the field effect transistor. A "bottom active region" refers to an active region of a field effect transistor that is located below another active region of the field effect transistor.

As used herein, a "semiconducting material" refers to a material having electrical conductivity in the range from $1.0 \times 10^{-6}$ S/cm to $1.0 \times 10^{5}$ S/cm. As used herein, a "semiconductor material" refers to a material having electrical conductivity in the range from $1.0 \times 10^{-6}$ S/cm to $1.0 \times 10^{5}$ S/cm in the absence of electrical dopants therein, and is capable of producing a doped material having electrical conductivity in a range from 1.0 S/cm to $1.0 \times 10^{5}$ S/cm upon suitable doping with an electrical dopant. As used herein, an "electrical dopant" refers to a p-type dopant that adds a hole to a valence band within a band structure, or an n-type dopant that adds an electron to a conduction band within a band structure. As used herein, a "conductive material" refers to a material having electrical conductivity greater than $1.0 \times 10^{5}$ S/cm. As used herein, an "insulator material", "an insulating material" or a "dielectric material" refers to a material having electrical conductivity less than $1.0 \times 10^{-6}$ S/cm. As used herein, a "heavily doped semiconductor material" refers to a semiconductor material that is doped with electrical dopant at a sufficiently high atomic concentration to become a conductive material, i.e., to have electrical conductivity greater than $1.0 \times 10^{5}$ S/cm. A "doped semiconductor material" may be a heavily doped semiconductor material, or may be a semiconductor material that includes electrical dopants (i.e., p-type dopants and/or n-type dopants) at a concentration that provides electrical conductivity in the range from $1.0 \times 10^{-6}$ S/cm to $1.0 \times 10^{5}$ S/cm. An "intrinsic semiconductor material" refers to a semiconductor material that is not doped with electrical dopants. Thus, a semiconductor material may be semiconducting or conductive, and may be an intrinsic semiconductor material or a doped semiconductor material. A doped semiconductor material can be semiconducting or conductive depending on the atomic concentration of electrical dopants therein. As used herein, a "metallic material" refers to a conductive material including at least one metallic element therein. All measurements for electrical conductivities are made at the standard condition.

A monolithic three dimensional memory array is one in which multiple memory levels are formed above a single substrate, such as a semiconductor wafer, with no intervening substrates. The term "monolithic" means that layers of each level of the array are directly deposited on the layers of each underlying level of the array. In contrast, two-dimensional arrays may be formed separately and then packaged together to form a non-monolithic memory device.

For example, non-monolithic stacked memories have been constructed by forming memory levels on separate substrates and vertically stacking the memory levels, as described in U.S. Pat. No. 5,915,167 titled "Three Dimensional Structure Memory." The substrates may be thinned or removed from the memory levels before bonding, but as the memory levels are initially formed over separate substrates, such memories are not true monolithic three dimensional memory arrays.

The various three dimensional memory devices of the present disclosure can include a ReRAM device, and can be fabricated employing the various embodiments described herein. It is understood that a criss-cross array of memory elements that can be accessed by any access scheme can be employed for the resistive memory devices of the present disclosure, and the exemplary structures of the present disclosure are described herein merely provide non-limiting examples of implementation of the memory devices of the present disclosure.

Referring to FIGS. 1A-1E, an exemplary structure is illustrated, which can be an in-process ReRAM device. As used herein, a "prototype" structure or an "in-process" structure refers to a transient structure that is subsequently modified in the shape or composition of at least one component therein.

The exemplary structure includes a substrate 6, which includes an insulating layer at an upper portion thereof. In one embodiment, the substrate 6 can be a stack of at least two material layers such as a stack of an underlying substrate material layer and an overlying substrate insulating layer. The substrate material layer can be a semiconductor material layer, a conductive material layer, or an insulating material layer that can provide structural support to the overlying structures, and may have a thickness greater than 50 microns, and typically in a range between 300 microns and 3 mm.

In one embodiment, the substrate material layer can be a semiconductor wafer, such as a silicon wafer as known in the art. The substrate insulating layer can include an insulating material, and can have a thickness in a range from 100 nm to 3 microns, although lesser and greater thicknesses can also be employed.

In case the substrate material layer includes a semiconductor material, peripheral semiconductor devices for operation of a memory array device can be formed in, or on, the substrate material layer. For example, sense amplifiers, input-output (I/O) circuitry, control circuitry, and any other necessary peripheral circuitry can be formed on, or in, the substrate material layer. Additional devices that can be formed in, or on, the substrate material layer include, but are not limited to, global bit line select transistors for selecting global bit lines to be activated, local bit line select transistors for selecting local bit lines to be activated, and word line select transistor for selecting word lines to be activated.

Conductive structures are formed over the substrate 6. The conductive structures can include global bit lines 10, contact pad structures 110, and dummy conductive structures 210. The global bit lines 10 can be formed in the memory array region 100 in which a memory array is to be subsequently formed. The pad structures 110 can be formed in contact regions 300 in which tab portions of gate electrode lines and contact via structures are to be subsequently formed. The dummy conductive structures 210 may be optionally formed in peripheral regions to function as planarization stopping structures and/or etch stop structures.

The global bit lines 10 laterally spaced from one another by a dielectric material layer 8, which may be formed before, or after, formation of the global bit lines 10. The global bit lines 10 are parallel electrically conductive lines that are laterally spaced apart in a first horizontal direction hd1, and extending in a second horizontal direction hd2. A one-dimensional array of the global bit lines 10 can extend along the second horizontal direction hd2. The global bit lines 10 can include, for example, at least one elemental metal (such as W, Co, Cu, and Al), a conductive doped semiconductor material, an intermetallic alloy including at least two elemental metals, a conductive metallic nitride, or a conductive metallic carbide. For example, the global bit lines 10 can include a metallic barrier layer including a metallic nitride material such as TiN, TaN, or WN, and a metal layer including an elemental metal or an intermetallic alloy, such as W, Ti, Ta, Cu, Al, or an alloy thereof.

The global bit lines 10, the contact pad structures 110, and the dummy conductive structures 210 can be formed, for example, by depositing at least one conductive material layer, and patterning the at least one conductive material layer employing a combination of lithographic methods and an anisotropic etch. In this case, the dielectric material layer 8 can be formed by deposition of an insulating material between the global bit lines 10, followed by planarization of the dielectric material layer 8.

Alternatively, the one-dimensional array of the global bit lines 10 the contact pad structures 110, and the dummy conductive structures 210 may be formed by depositing the dielectric material layer 8, forming line trenches and/or recesses in the dielectric material layer 8, and filling the trenches and/or recesses with at least one conductive material, followed by planarization of the conductive material (e.g., a damascene process).

Referring to FIGS. 2A-2D, a planar layer stack (11L, 114L, 19L, 20L) is formed over the global bit lines 10. The planar layer stack (11L, 114L, 19L, 20L) can include, from bottom to top, an optional lower metal nitride layer 11L, a bottom semiconductor layer 114B, a channel semiconductor layer 114C, a top semiconductor layer 114T, an optional upper metal nitride layer 19L, and an optional hard mask layer 20L.

The lower metal nitride layer 11L includes a conductive metal nitride material such as TiN, TaN, WN, or a stack thereof. In one embodiment, the lower metal nitride layer 11L can function as a diffusion barrier between the metallic materials of the global bit lines 10 and the bottom semiconductor layer 114B. In one embodiment, the lower metal nitride layer 11L can have a thickness in a range from 3 nm to 60 nm, such as from 6 nm to 30 nm. The lower metal nitride layer 11L can be deposited by chemical vapor deposition or atomic layer deposition.

The bottom semiconductor layer 114B and the top semiconductor layer 114T can include a respective semiconductor material having a doping of a first conductivity type. The first conductivity type can be p-type or n-type. The dopant concentration in the bottom semiconductor layer 114B and the top semiconductor layer 114T can be in a range from $1.0 \times 10^{19}/cm^3$ to $2.0 \times 10^{21}/cm^3$, although lesser and greater dopant concentrations can also be employed. The thickness of the bottom semiconductor layer 114B can be the thickness of the bottom active regions of the access vertical field effect transistors to be formed, and the thickness of the top semiconductor layer 114T can be the thickness of the top active regions of the access vertical field effect transistors to be formed. For example, the thickness of the bottom semiconductor layer 114B can be in a range from 30 nm to 300 nm, and the thickness of the top semiconductor layer 114T can be in a range from 30 nm to 300 nm.

The channel semiconductor layer 114C can include a semiconductor material having a second conductivity type that is the opposite type of the first conductivity type. The dopant concentration in the channel semiconductor layer 114C can be in a range from $1.0 \times 10^{14}/cm^3$ to $2.0 \times 10^{18}/cm^3$, although lesser and greater dopant concentrations can also be employed. The thickness of the channel semiconductor layer 114C can be the channel length of the access vertical field effect transistors to be formed. For example, the thickness of the channel semiconductor layer 114C can be in a range from 100 nm to 3,000 nm, although lesser and greater thicknesses can also be employed. The bottom semiconductor layer 114B, the channel semiconductor layer 114C, and the top semiconductor layer 114T are collectively referred to as a semiconductor layer stack 114L.

The upper metal nitride layer 19L includes a conductive metal nitride material such as TiN, TaN, WN, or a stack thereof. In one embodiment, the upper metal nitride layer 19L functions as a diffusion barrier layer and as an etch stop layer in a subsequent etch process that forms alternating stacks that include word lines for memory cells. In one embodiment, the upper metal nitride layer 19L can have a thickness in a range from 10 nm to 40 nm, although lesser and greater thicknesses can also be employed. The upper metal nitride layer 19L can be deposited by chemical vapor deposition or atomic layer deposition.

The hard mask layer 20L includes a material that can be function as a hard mask during a subsequent etch process that patterns the metallic nitride layer 19L and the semiconductor layer stack 114L. In one embodiment, the hard mask layer 20L includes silicon nitride or a dielectric metal oxide (such as aluminum oxide). The thickness of the hard mask layer 20L can be in a range from 30 nm to 300 nm, although lesser and greater thicknesses can also be employed. The hard mask layer 20L can be deposited, for example, by chemical vapor deposition (CVD).

Referring to FIGS. 3A-3E, a photoresist layer 37 is applied over the hard mask layer 20L, and is lithographically patterned to form a pattern of ellipses or a pattern of polygons (such as rectangles) in the memory array region 100 and discrete patterns having polygonal shapes and/or elliptical shapes in the peripheral region. As used herein, ellipses include circles, which is a limiting case of ellipses in which the eccentricity becomes 0. The photoresist layer 37 can be patterned such that the remaining areas of the photoresist layer 37 overlap with the areas of the global bit lines 10 in the memory array region 100. In one embodiment, the remaining areas of the photoresist layer 37 in the memory array region 100 can be entirely within the areas of the global bit lines 10. The patterned photoresist layer 37 can include portions that overlap with the dummy conductive structures 210 in the peripheral regions.

The pattern in the photoresist layer 37 can be transferred through the hard mask layer 20L, the upper metal nitride layer 19L, the semiconductor layer stack 114L, and the lower metal nitride layer 11L by at least one anisotropic etch process. A two-dimensional array of pillar structures (11, 14T, 14C, 14B, 19, 20) is formed in the memory array region 100. The two-dimensional array of pillar structures (11, 14T, 14C, 14B, 19, 20) can be a periodic two-dimensional array. Dummy pillar structures (11, 14B', 14C', 14T', 19, 20) are formed in the peripheral region. Each pillar structure (11, 14T, 14C, 14B, 19, 20) can have a uniform horizontal cross-sectional shape (which may be an elliptical shape) that is invariant with the distance from the horizontal plane including the top surfaces of the global bit lines 10. Each dummy pillar structure (11, 14B', 14C', 14T', 19, 20) can have a uniform horizontal cross-sectional shape (which may be a polygonal shape or an elliptical shape) that is invariant with the distance from the horizontal plane including the top surfaces of the global bit lines 10.

Each pillar structures (11, 14T, 14C, 14B, 19, 20) includes a lower metal nitride portion 11, a bottom active region 14B (e.g., source region), a channel region 14C, a top active region 14T (e.g., drain region), an upper metal nitride portion 19, and a hard mask portion 20. Each dummy pillar structures (11, 14B', 14C', 14T', 19, 20) includes a lower metal nitride portion 11, a bottom semiconductor portion 14B', a middle semiconductor portion 14C', a top semiconductor portion 14T', an upper metal nitride portion 19, and a hard mask portion 20.

Remaining portions of the hard mask layer 20L include hard mask portions 20 of the pillar structures (11, 14T, 14C, 14B, 19, 20) and the dummy pillar structures (11, 14B', 14C', 14T', 19, 20). Remaining portion of the upper metal nitride layer 19L include upper metal nitride portions 19 of the pillar structures (11, 14T, 14C, 14B, 19, 20) and the dummy pillar structures (11, 14B', 14C', 14T', 19, 20). Remaining portions of the semiconductor layer stack 114L include semiconductor pillars (14T, 14C, 14B) formed in the memory array region 100 and dummy semiconductor pillars (14T', 14C', 14B') formed in the peripheral region. Each semiconductor pillar (14T, 14C, 14B) includes a top active region 14T, a channel region 14C, and a bottom active region 14B. Each dummy semiconductor pillar (14T, 14C, 14B) includes a top dummy region 14T, a dummy channel region 14C, and a bottom dummy region 14B. Remaining portions of the lower metal nitride layer 11L include lower metal nitride portions 11. The photoresist layer 37 can be subsequently removed, for example, by ashing.

The maximum lateral dimension of each semiconductor pillar (14T, 14C, 14B) along the first horizontal direction hd1 can be less than the width of the global bit lines 10. In one embodiment, the maximum lateral dimension of the semiconductor pillars (14T, 14C, 14B) can be in the diameter or the major axis.

Figure 3E:
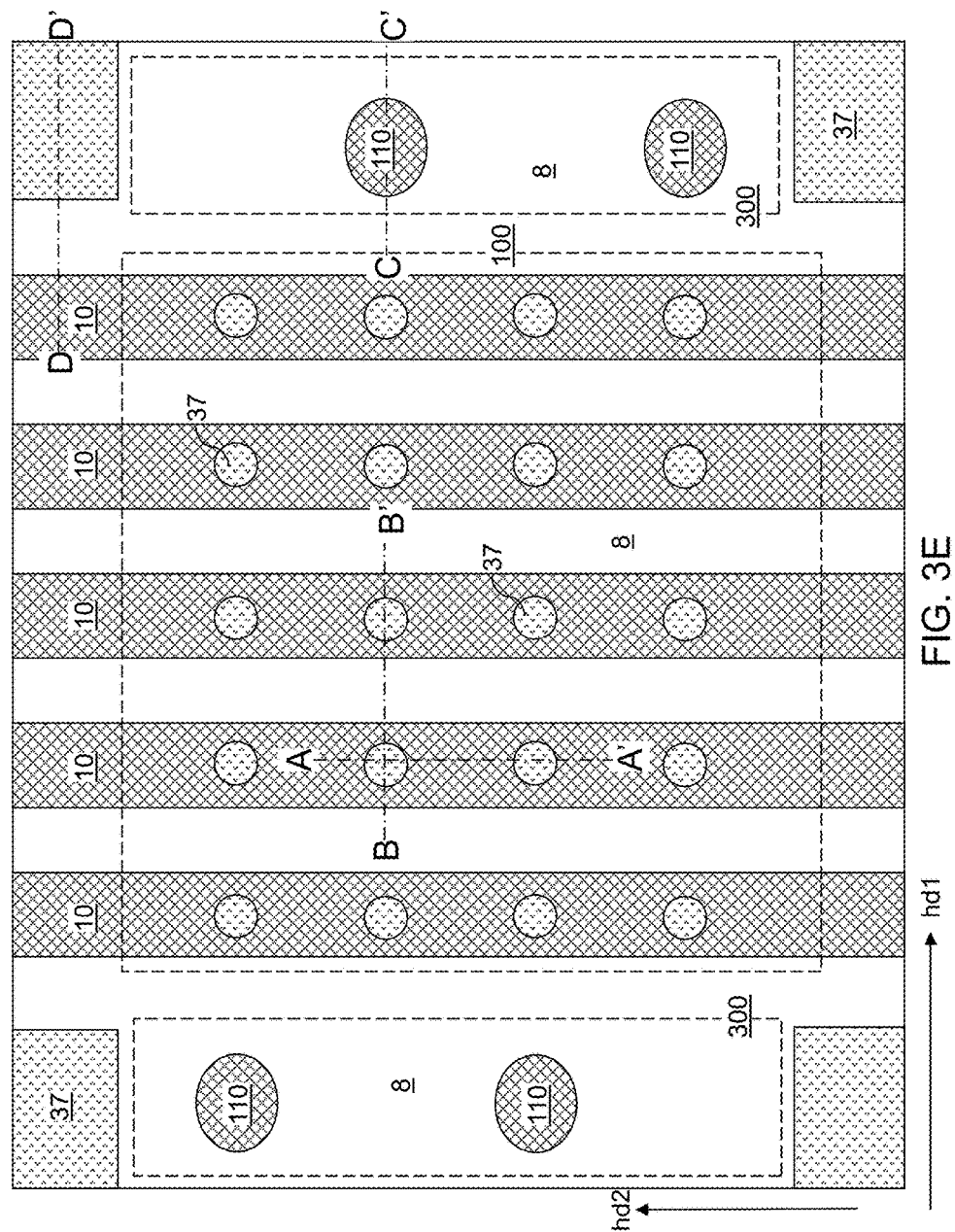
Figure 3F:
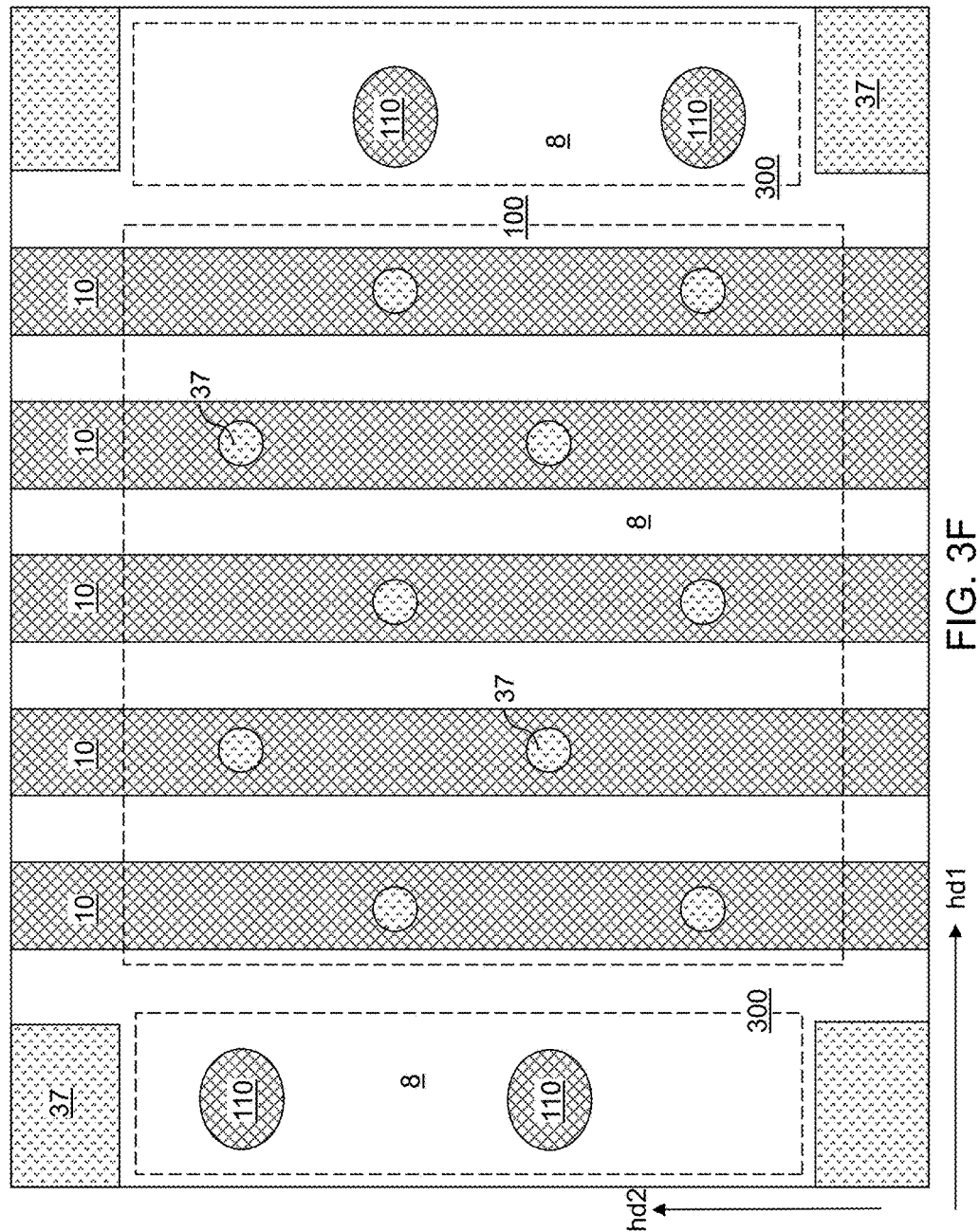
FIG. 3F is a top-down view of an alternative configuration for the exemplary structure of FIGS. 3A-3E.
Figure 4E:
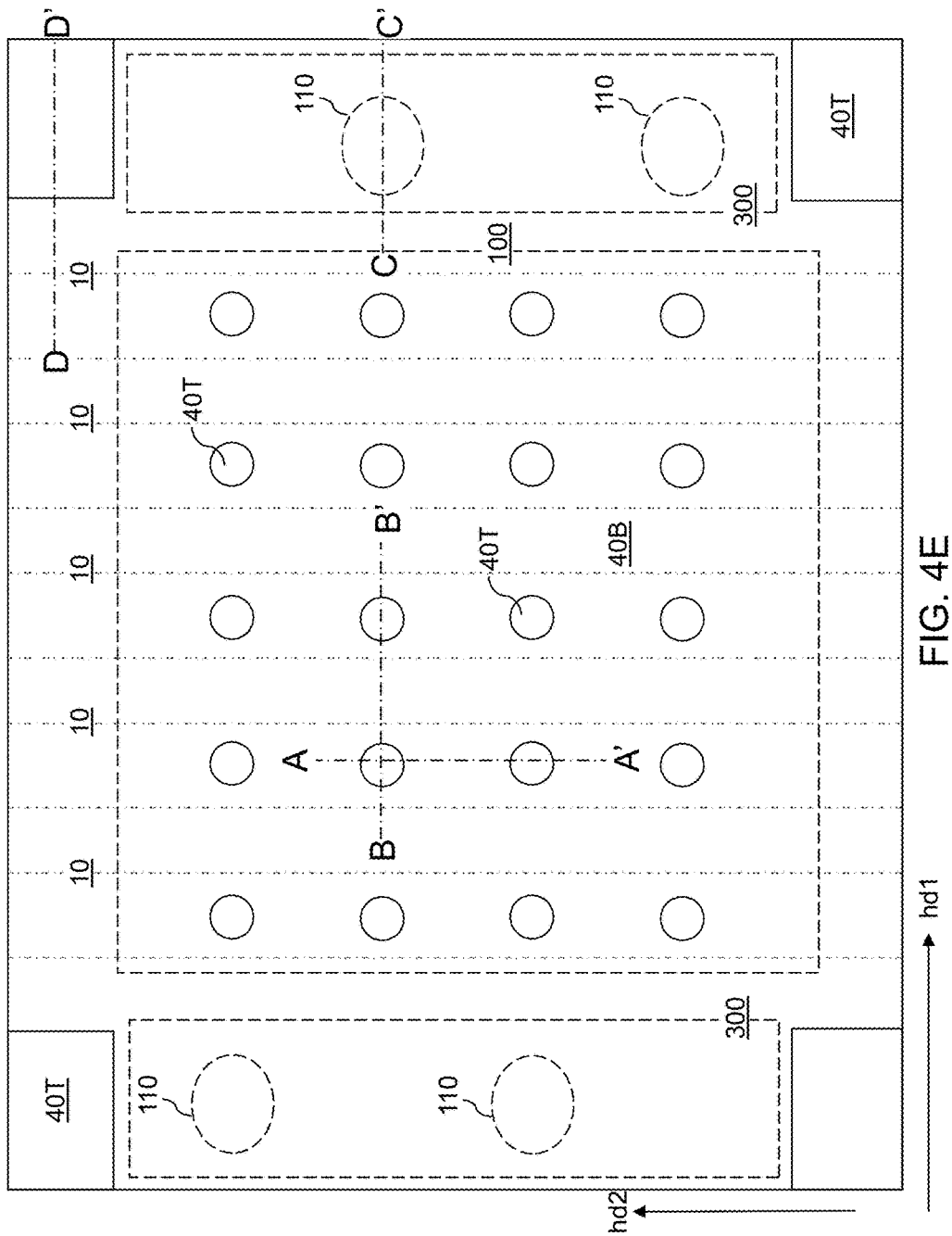
Figure 5E:
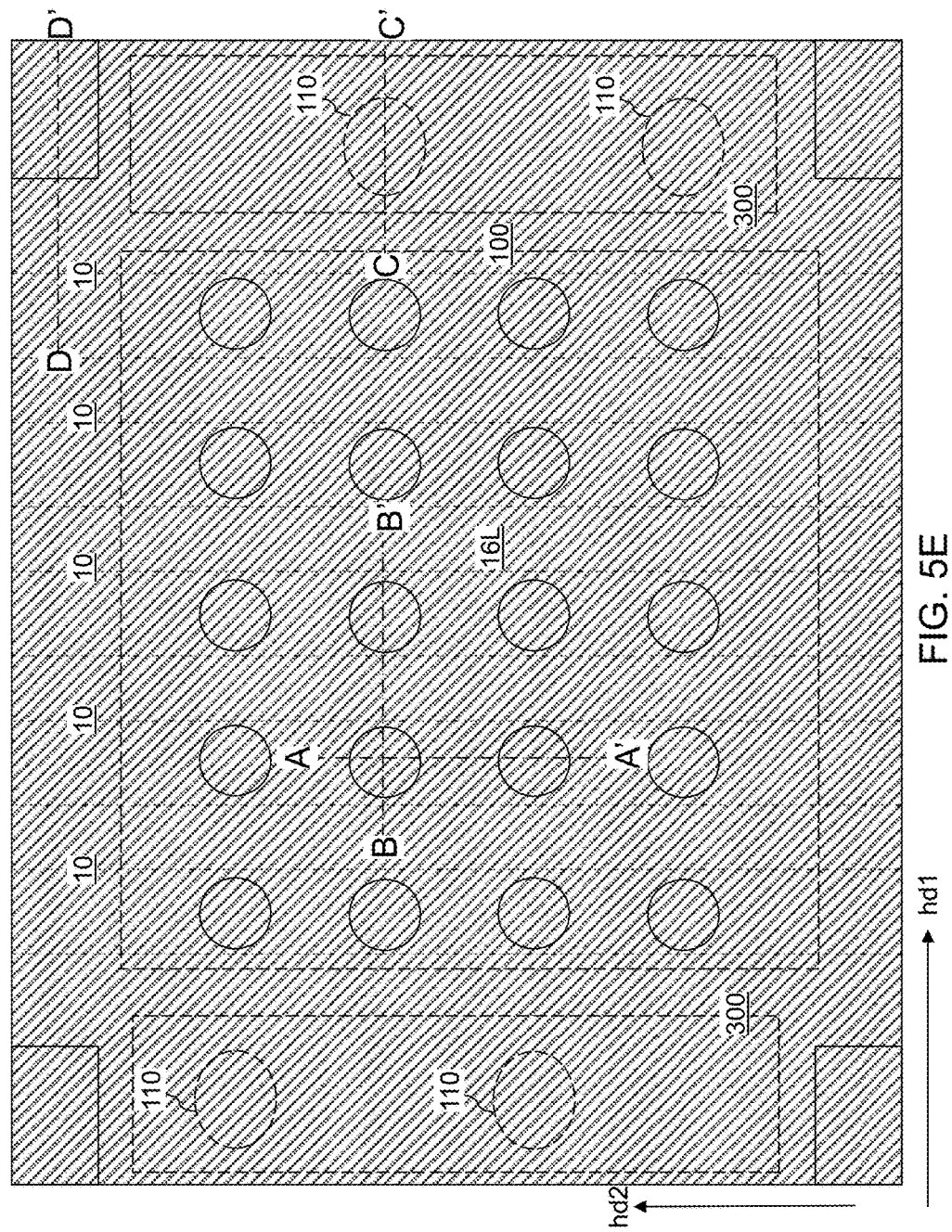
Figure 6B:
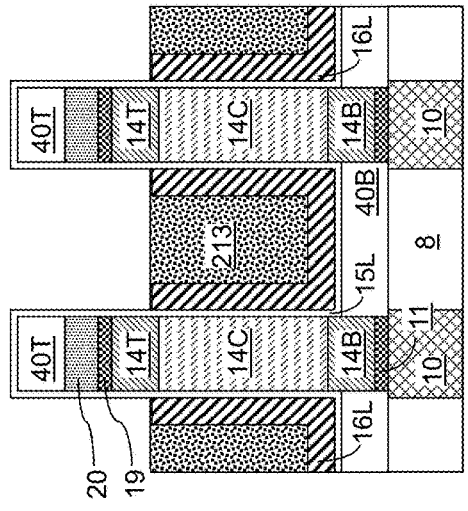
FIGS. 6A-6E are various views of the exemplary structure after formation of gate electrodes according to an embodiment of the present disclosure.
Figure 6D:
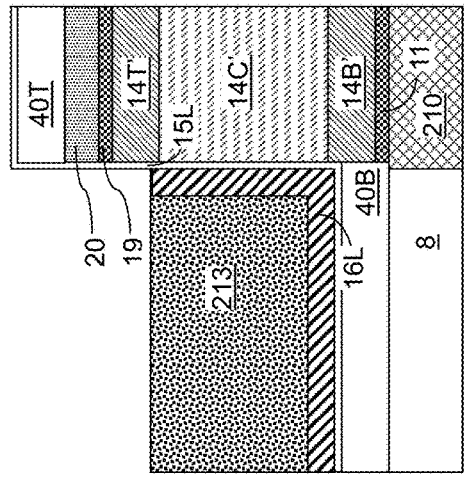
Figure 6A:
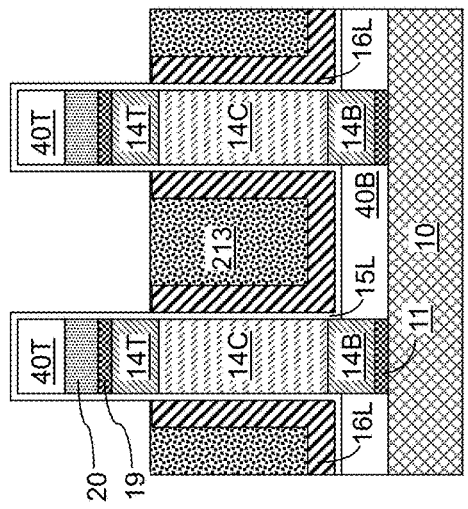
Figure 6C:
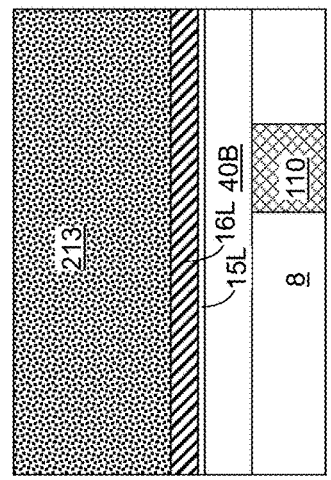
Figure 6E:
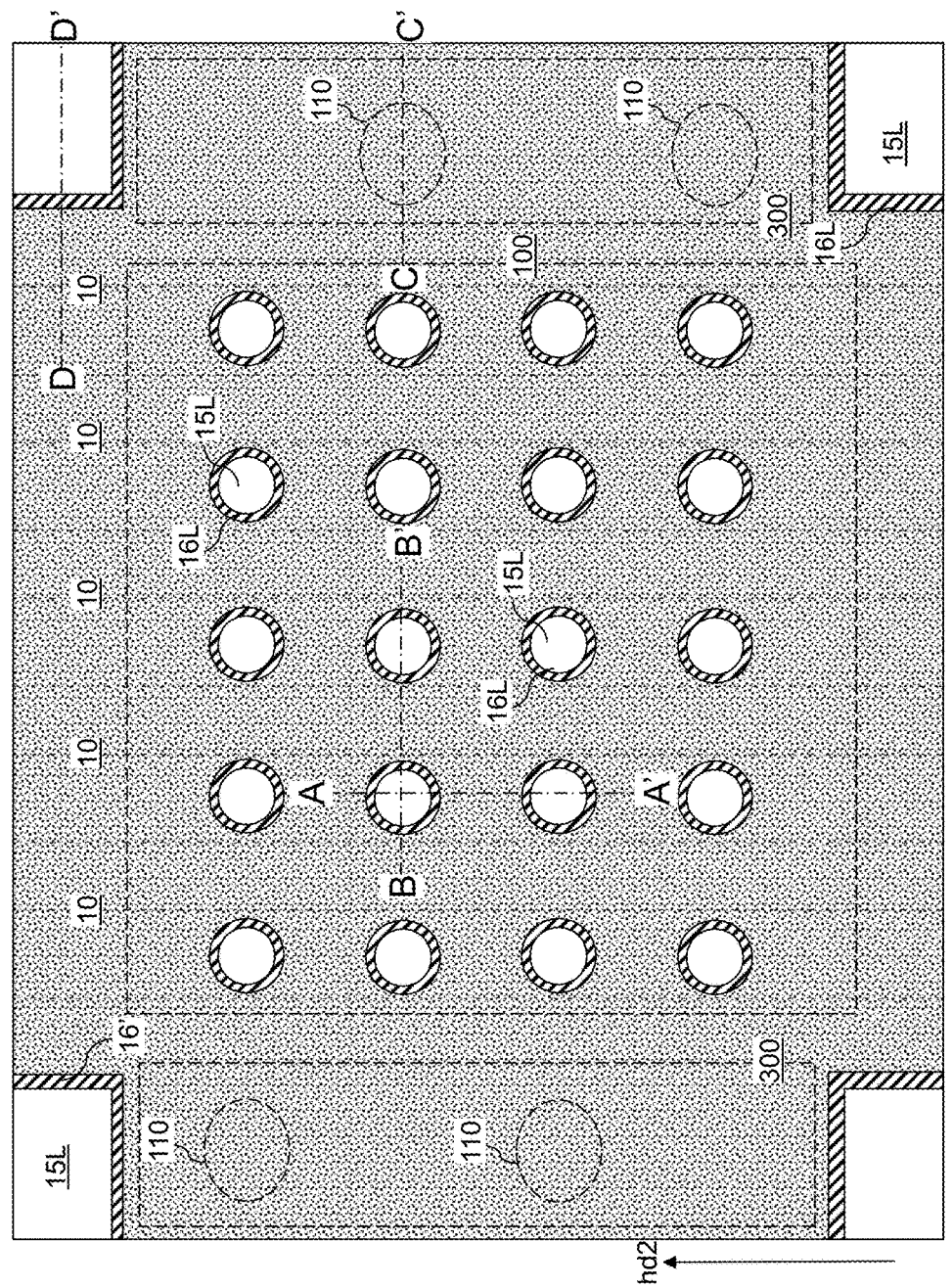
Figure 8A:
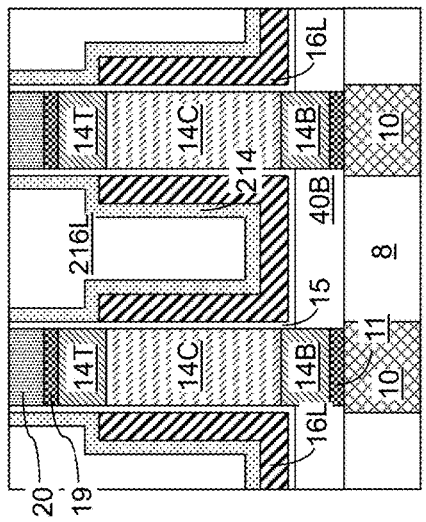
FIGS. 8A-8E are various views of the exemplary structure after formation of a dielectric fill material layer having a planar top surface and removal of cap dielectric portions according to an embodiment of the present disclosure.
Figure 8B:
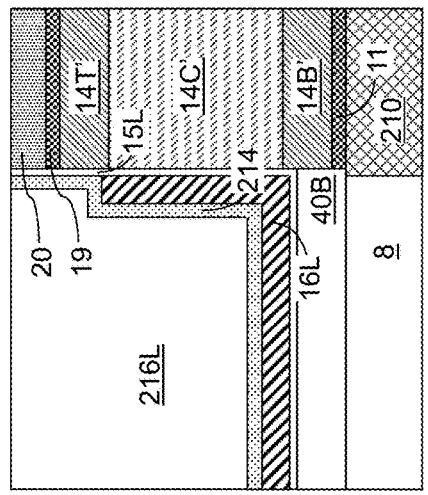
Figure 8C:
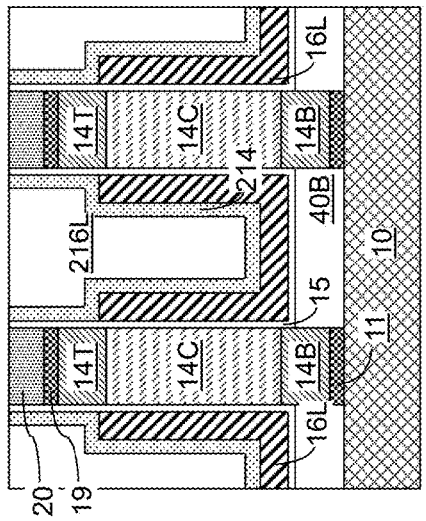
Figure 8D:
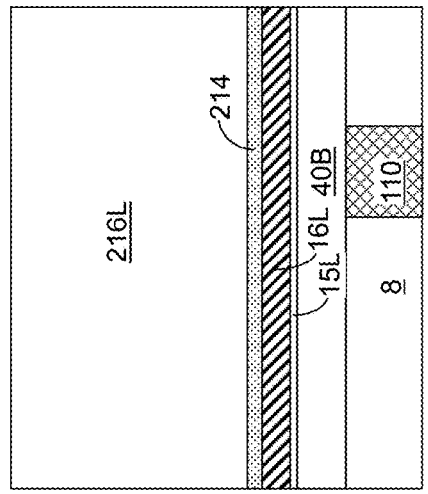
Figure 8E:
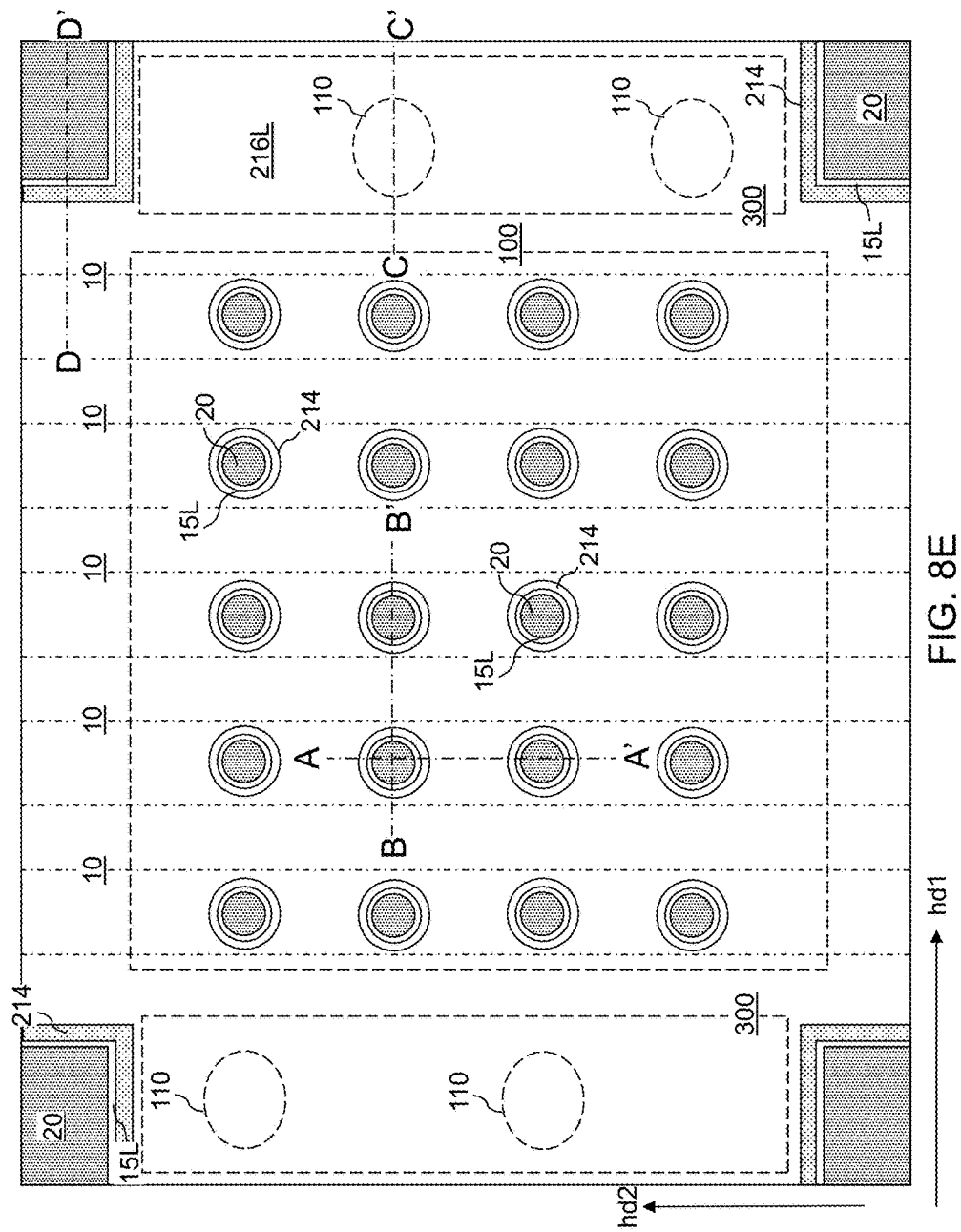
Figure 9E:
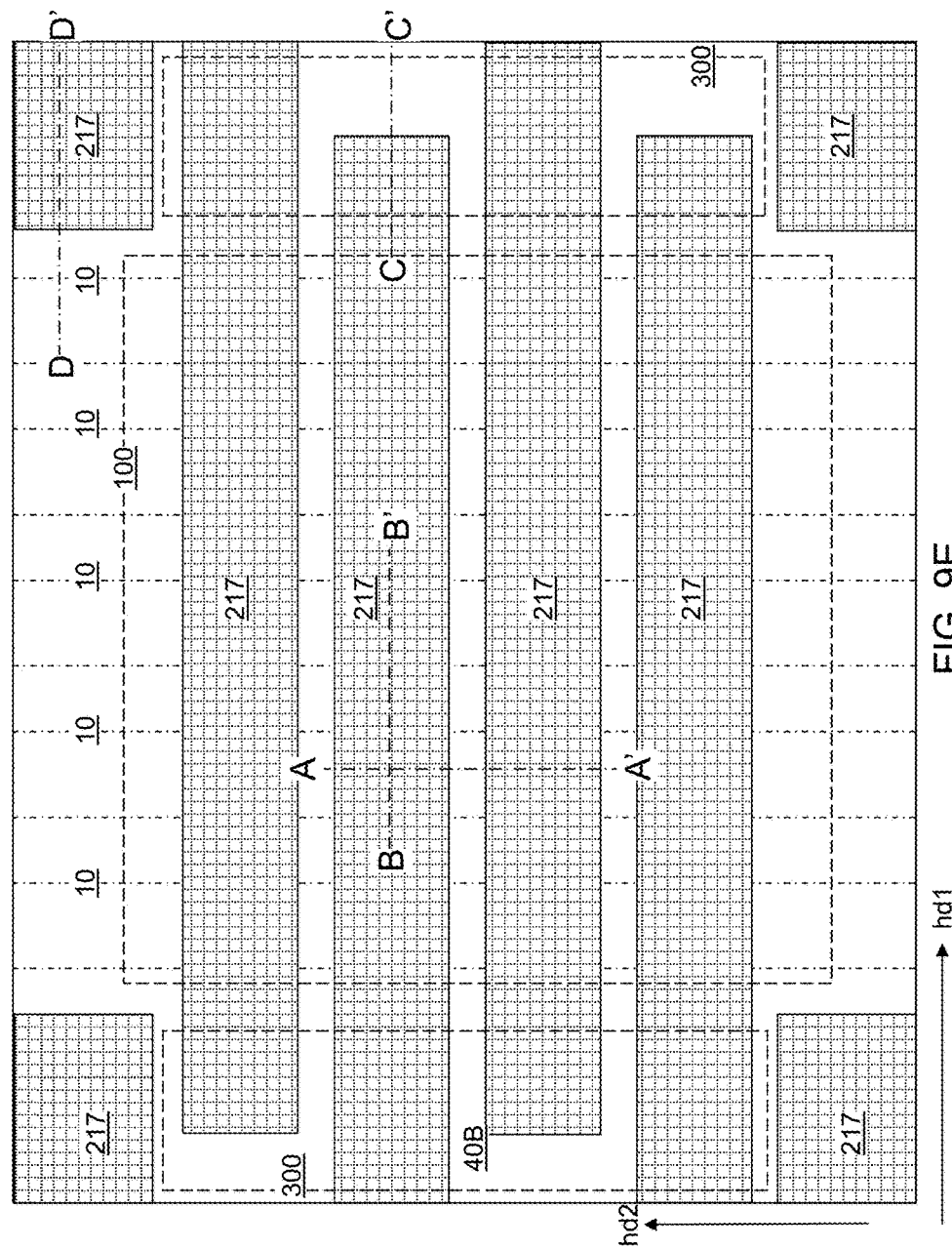
Figure 10A:
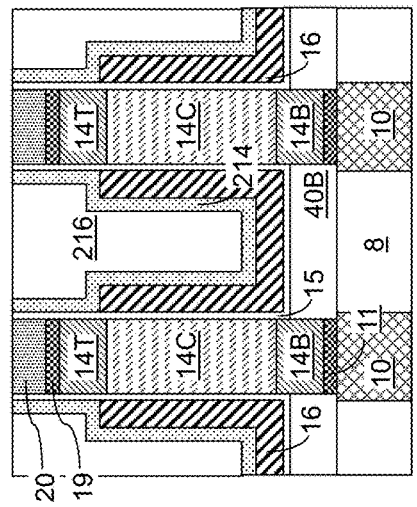
FIGS. 10A-10E are various views of the exemplary structure after removal of a patterned photoresist layer according to an embodiment of the present disclosure.
Figure 10B:
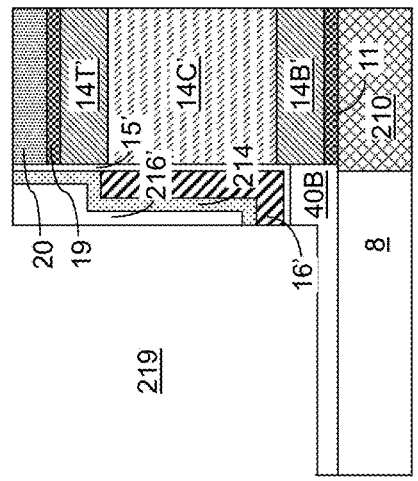
Figure 10C:
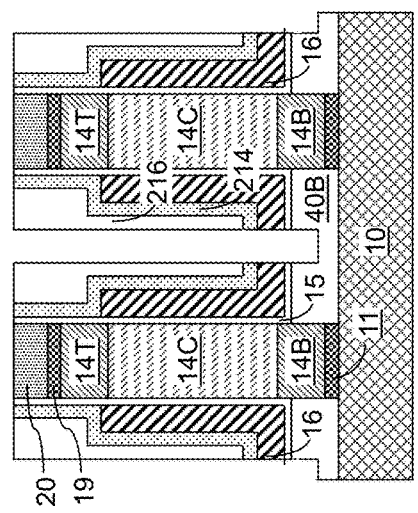
Figure 10D:
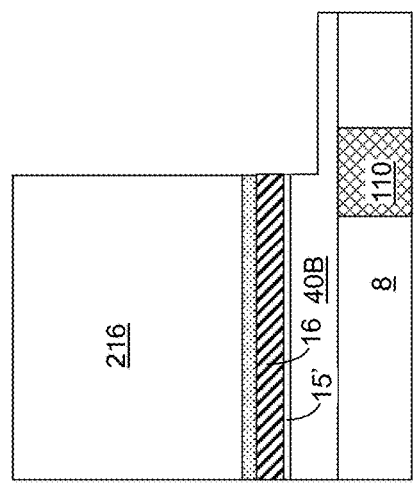
Figure 10E:
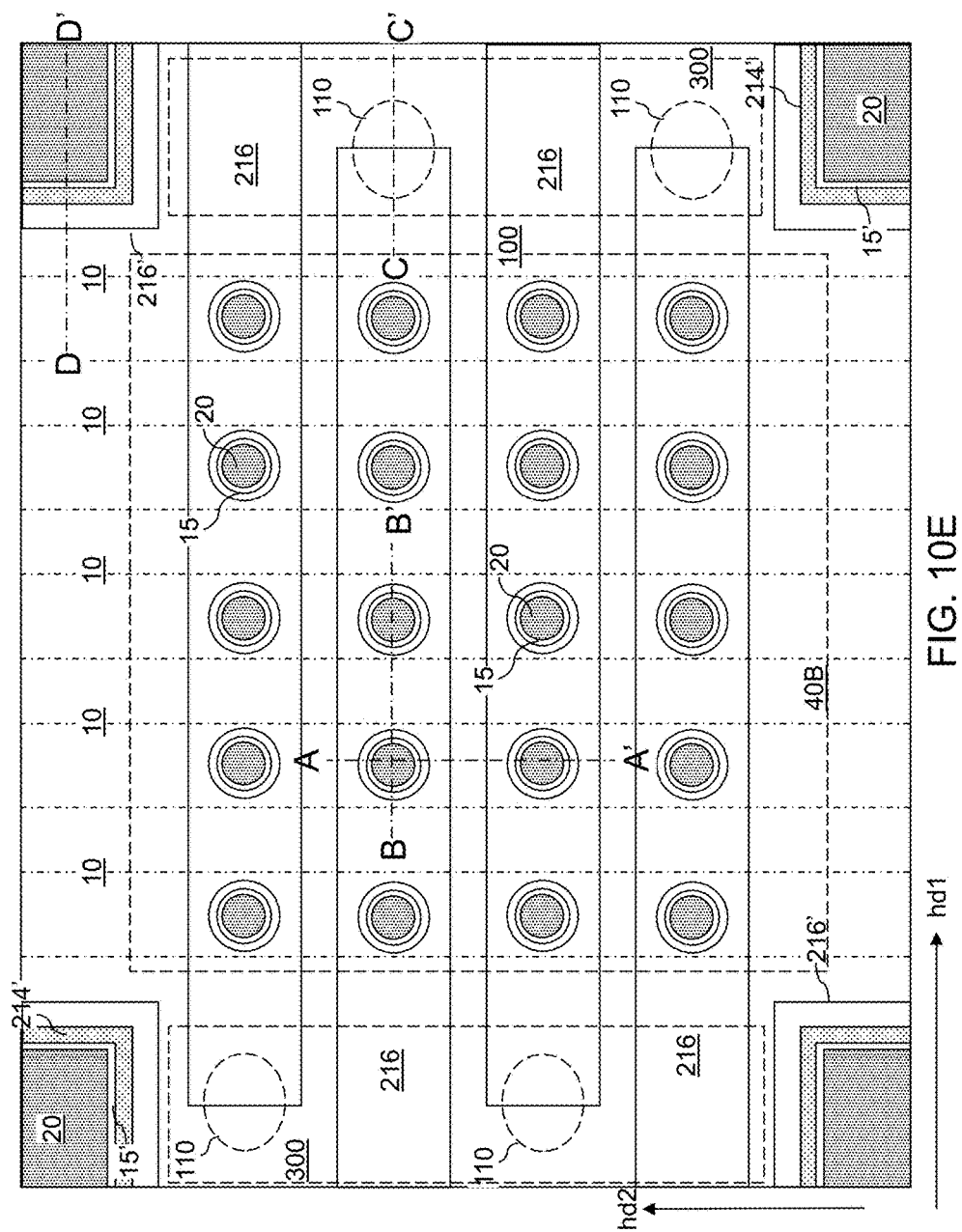

The semiconductor pillars (14T, 14C, 14B) may be formed as a two-dimensional rectangular array at each intersection region between the global bit lines 10 and the gate electrode lines (e.g., select gate electrode lines for vertical select transistors) to be subsequently formed. Alternatively, the semiconductor pillars (14T, 14C, 14B) may be formed at a subset of the intersection region between the global bit lines 10 and the gate electrode lines to be subsequently formed. FIG. 3F illustrates an alternative staggered pillar configuration for the exemplary structure in which the semiconductor pillars (14T, 14C, 14B) may be formed at a subset of the intersection region between the global bit lines 10 and the gate electrode lines to be subsequently formed.

Referring to FIGS. 4A-4E, a dielectric material is anisotropically deposited on horizontal surfaces of the exemplary structure, while minimizing deposition on vertical surfaces of the exemplary structure. The dielectric material can include doped silicate glass or undoped silicate glass (e.g., silicon oxide). The dielectric material can be deposited by chemical vapor deposition (e.g., flowable oxide deposition or high density plasma oxide deposition) or by physical vapor deposition. Optionally, portions of the deposited dielectric material on vertical surfaces can be removed by an etch back process, which can be an isotropic etch process such as a wet etch process.

An isolation dielectric layer 40B can be formed on the physically exposed top surfaces of the global bit lines 10 and the dielectric material layer 8. The isolation dielectric layer 40B can be formed as a continuous material layer having openings around each semiconductor pillar (14T, 14C, 14B). The thickness of the isolation dielectric layer 40B can be selected such that the top surface of the isolation dielectric layer 40B is formed within a horizontal plane at which a bottom surface of each gate electrode line is to be subsequently formed. For example, the isolation dielectric layer 40B should be thinner than the bottom active region 14B and the thickness of the isolation dielectric layer 40B can be in a range from 30 nm to 300 nm. Cap dielectric portions 40T can be formed on the top surfaces of the hard mask portions 20.

Referring to FIGS. 5A-5E, a gate dielectric layer 15L can be formed on the sidewalls of the pillar structures (11, 14T, 14C, 14B, 19, 20) and the dummy pillar structures (11, 14B', 14C', 14T', 19, 20). The gate dielectric layer 15L can be formed as a continuous material layer by conformal deposition of at least one gate dielectric material (such as silicon oxide and/or a dielectric metal oxide) on the physically exposed surfaces of the pillar structures (11, 14T, 14C, 14B, 19, 20), the dummy pillar structures (11, 14B', 14C', 14T', 19, 20), the isolation dielectric layer 40B, and the cap dielectric portions 40T. In one embodiment, the gate dielectric layer 15L can include a layer stack including a silicon oxide layer and a dielectric metal oxide (such as aluminum oxide) layer. Alternatively, the gate dielectric layer 15L can be formed by thermal oxidation and/or plasma oxidation of physically exposed sidewalls of the pillar structures (11, 14T, 14C, 14B, 19, 20) and the dummy pillar structures (11, 14B', 14C', 14T', 19, 20), such as by wet oxidation in a water vapor containing ambient. The thickness of the gate dielectric layer 15L can be in a range from 1 nm to 6 nm, although lesser and greater thicknesses can also be employed.

While the present disclosure is described employing an embodiment in which the gate dielectric layer 15L is formed by deposition of a dielectric material to form a continuous conformal material layer, embodiments are expressly contemplated herein in which the gate dielectric layer 15 is formed by thermal and/or plasma oxidation of the surface portions of the semiconductor portions of the pillar structures (14T, 14C, 14B) and the semiconductor portions of the dummy pillar structures (14B', 14C', 14T').

Subsequently, a gate electrode layer 16L can be deposited as a conformal conductive material layer on the gate dielectric layer 15L and on the isolation dielectric layer (40B, 40T). The gate electrode layer 16L includes a conductive material such as an elemental metal, an intermetallic alloy, a heavily doped semiconductor material, a metal-semiconductor alloy such as a metal silicide material, a conductive metallic nitride such as TiN, TaN, or WN, or a combination thereof. The gate electrode layer 16L can be deposited by a conformal deposition process such as chemical vapor deposition or atomic layer deposition. The thickness of the gate electrode layer 16L can be in a range from 5 nm to 100 nm, such as from 10 nm to 50 nm, although lesser and greater thicknesses can also be employed.

Referring to FIGS. 6A-6E, top portions of the gate electrode layer 16L can be removed (e.g., recessed) to tailor the vertical extent of the gate electrode lines to be subsequently formed. For example, a sacrificial mask material layer 213 can be applied over the gate electrode layer 16L. The sacrificial mask material of the sacrificial mask material layer 213 can include, for example, a photoresist material, an organic polymer material, an inorganic polymer material, a carbon-based material such as amorphous carbon, or any other suitable material that is self-planarizing or can be planarized. The sacrificial mask material can be vertically recessed to a height that is lower than top surfaces of the semiconductor pillars (14T, 14C, 14B). The sacrificial mask material can be vertically recessed such that the recessed top surface of the sacrificial mask material is located at the height at which the top edges of the gate electrode lines are to be subsequently formed (i.e., above the top of portion 14C and above the bottom of portion 14T). Thus, the height of the sacrificial mask material after the recess process determines the overlap of the top active regions 14T with the gate electrode lines to be formed.

Physically exposed portions of the gate electrode layer 16L can be removed by an etch process that employs the recessed sacrificial mask material layer as an etch mask. The etch process may be an anisotropic or an isotropic etch process. For example, an RIE etch or wet etch chemistry that etches electrically conductive materials selective to dielectric materials can be employed. In one embodiment, the etch chemistry can be selective to the material of the gate dielectric layer 15L. Subsequently, the sacrificial material layer 213 can be removed selective to the gate electrode layer 16L, for example, by ashing.

Referring to FIGS. 7A-7D, a dielectric liner 214 can be deposited by a conformal deposition process such as chemical vapor deposition or atomic layer deposition. The dielectric liner 214 includes a dielectric material such as silicon nitride or a dielectric metal oxide (e.g., aluminum oxide or titanium oxide). The thickness of the dielectric liner 214 can be in a range from 3 nm to 30 nm, although lesser and greater thicknesses can also be employed. The dielectric liner 214 covers exposed portions of layers 15L and 16L.

Referring to FIGS. 8A-8E, a dielectric fill material can be deposited in the unfilled volumes below the horizontal surface including the top surfaces of the hard mask portions 20. The dielectric fill material can include a self-planarizing material such as a spin-on glass material, or a planarizable dielectric material such as undoped silicate glass or doped silicate glass. The cap dielectric portions 40T and portions of the dielectric fill material, the dielectric liner 214, and the gate dielectric layer 15L overlying the horizontal plane including the top surfaces of the hard mask portions 20 can be removed by a planarization process such as chemical mechanical planarization (CMP). The hard mask portions 20 overlying the semiconductor pillars (14B, 14C, 14T) and the dummy semiconductor pillars (14B', 14C', 14T') can be employed as stopping structures during the planarization process. The remaining portion of the dielectric fill material constitutes a dielectric fill material layer 216L, which has a planar top surface located within the horizontal plane including the top surfaces of the hard mask portions 20.

Referring to FIGS. 9A-9E, a patterned mask layer 217 is formed over the exemplary structure. The patterned mask layer 217 can be a patterned photoresist layer, or can be a patterned hard mask layer. Within the memory array region 100, the patterned mask layer 217 includes a strip pattern that laterally extends along directions that are perpendicular to the lengthwise directions of the global bit lines 10. For example, the strip pattern can laterally extend along the first horizontal direction hd1 in the memory region. The strip pattern can extend into contact regions such that edges of the strip patterns can be located within areas in which contact via structures are to be subsequently formed. Further, the patterned mask layer 217 can include additional portions that cover the dummy semiconductor pillars (14B', 14C', 14T').

The pattern in the patterned mask layer 217 can be transferred through the dielectric fill material layer 216L, the dielectric liner 214, the gate electrode layer 16L, and the gate dielectric layer 15L, and into an upper portion of the isolation dielectric layer 40B. The gate electrode layer 16L is divided into a plurality discrete and disjoined gate electrode lines 16. Each gate electrode line 16 can have sidewalls that are vertically coincident with sidewalls of an overlying discrete portion of the patterned mask layer 217. As used herein, a first sidewall and a second sidewall are vertically coincident with each other if the second sidewall overlies or underlies the first sidewall and if there exists a vertical plane including the first sidewall and the second sidewall.

The gate dielectric layer 15L is divided into a plurality discrete and disjoined gate dielectrics 15. Each gate dielectrics 15 can have sidewalls that are vertically coincident with sidewalls of an overlying discrete portion of the patterned mask layer 217. Each gate dielectrics 15 includes a horizontal layer portion having a uniform thickness (i.e., the thickness of the gate dielectric layer 15L as deposited) throughout, and further includes a plurality of surrounding portions that laterally surround, and directly contacts, a respective one of the channel regions 14C of the semiconductor pillars (14T, 14C, 14B). If the pillars are cylindrical, then the surrounding portions can be cylindrical portions. Other shapes may also be used. Each cylindrical portion is adjoined to the horizontal layer portion. Each remaining portion of the gate dielectric layer 15L that is formed adjacent to a dummy semiconductor pillar (14B', 14C', 14T') is herein referred to as a dummy gate dielectric layer 15'.

The gate electrode layer 16L is patterned into multiple gate electrodes 16 that laterally extend along the first horizontal direction hd1 and spaced apart along the second horizontal direction hd2. The gate electrode lines 16 are formed directly on a sidewall of a respective one of the gate dielectrics. Each gate electrode line 16 includes a horizontal layer portion having a uniform thickness (i.e., the thickness of the gate electrode layer 16L as deposited) throughout, and further includes a plurality of surrounding portions that laterally surround a respective one of the gate dielectrics 15 and the channel regions 14C of the semiconductor pillars (14T, 14C, 14B). If the pillars are cylindrical, then the surrounding portions can be cylindrical portions. Other shapes may also be used. Each cylindrical portion is adjoined to the horizontal layer portion. Each remaining portion of the gate electrode layer 16L that is formed adjacent to a dummy semiconductor pillar (14B', 14C', 14T') is herein referred to as a dummy gate electrode structure 16'.

The dielectric fill material layer 216L is divided into a plurality of dielectric spacers 216. Each dielectric spacer 216 has a pair of vertical sidewalls that laterally extend along the first horizontal direction and parallel to each other. Each dielectric spacer 216 laterally surrounds a row of semiconductor pillars (14T, 14C, 14B) and the cylindrical portions of the underlying gate electrode line 16. Each dielectric spacer 216 can have sidewalls that are vertically coincident with sidewalls of an overlying discrete portion of the patterned mask layer 217. Each remaining portion of the dielectric fill material layer 216L that is formed adjacent to a dummy semiconductor pillar (14B', 14C', 14T') is herein referred to as a dummy dielectric structure 216'. In one embodiment, each dielectric spacer 216 laterally extends along the first horizontal direction hd1 and laterally surrounds a respective row of semiconductor pillars (14T, 14C, 14B) arranged along the first horizontal direction hd1, and sidewalls of the dielectric spacers 216 that extend along the first horizontal direction hd1 are vertically coincident with sidewalls of an underlying gate electrode line 16.

The dielectric liner 214 is divided into multiple portions such that outermost sidewalls of each remaining portion of the dielectric liner 214 is vertically coincident with sidewalls of an overlying discrete portion of the patterned mask layer 217. The patterned dielectric liner 214 acts as a stopper layer and protects the gate electrode lines 16 from damage during the selective etch which etches the gate electrode lines 16 selective to the dielectric liner 214. Therefore, even if there is a slight overlay misalignment of the patterned mask layer 217, the transistor gate electrode portion of each gate line 16 located adjacent to each semiconductor pillar (14B, 14C, 14T) is not damaged or etched.

Referring to FIGS. 10A-10E, the patterned mask layer 217 can be removed. For example, if the patterned mask layer 217 includes a photoresist material, the patterned mask layer 217 can be removed by ashing.

Referring to FIGS. 11A-11G, at least one dielectric fill material portion can be formed over the gate electrode lines 16 and the semiconductor pillars (14T, 14C, 14B) to provide a planar surface. In one embodiment, the at least one dielectric fill material portion can include the dielectric spacers 216 and a planarization dielectric layer 218. The planarization dielectric layer 218 can be formed within each trench among the dielectric spacers 216 and dummy dielectric structures 216'. The planarization dielectric layer 218 includes a self-planarizing material (such as a spin-on glass) or a planarizable material (such as undoped silicate glass or doped silicate glass) which is subsequently planarized.

In one embodiment, the planarization dielectric layer 218 includes a horizontal portion that overlies the gate electrode lines 16, the dielectric spacers 216, and the semiconductor pillars (14T, 14C, 14B) and further includes a plurality of vertical portions that protrude downward from the horizontal portion between each neighboring pair of gate electrode lines 16 and contacting the isolation dielectric layer 40B, as shown in FIG. 11A. Each vertical portion of the planarization dielectric layer 218 constitutes a dielectric rail structure 218R that laterally extends along the first horizontal direction hd1 and has a uniform width along the second horizontal direction hd2.

In one embodiment, via cavities can be formed though the at least one dielectric fill material portion (216, 218). The via cavities can be formed by an etch which stops on the dielectric liner 214 which functions as an etch stop layer. The via cavity etch then continues through the dielectric liner 214 until a top surface and a sidewall of a respective one of the gate electrode lines 16 is physically exposed within each of the via cavities. In one embodiment, the via cavities can vertically extend below the horizontal plane including bottom surfaces of the gate electrode lines 16 to top surfaces of the conductive structures 110. The top surfaces of the conductive structures 110 are located below the horizontal plane including the bottom surfaces of the gate electrode lines 16. The gate electrode lines 16 can function as select gate electrodes of vertical select field effect transistors of a ReRAM device.

At least one conductive material can be deposited in the via cavities to form gate contact via structures (e.g., zias) 88. The gate contact via structures 88 can include an electrically conductive barrier layer 88A, such as TiN, WN, etc., and a metal fill layer 88B, such as W, Ti, Cu, Al, etc. The gate contact via structures 88 can be formed directly on a top surface and a sidewall of a respective one of the gate electrode lines 16. In one embodiment, each of the gate contact via structures 88 comprises an upper portion having a bottom surface that contacts the top surface of the respective one of the gate electrode lines 16 and further comprises a lower portion having a sidewall that is vertically coincident with the sidewall of the respective one of the gate electrode lines 16 and contacting a top surface of one of the conductive structures 110. The gate contact via structures 88 contact the planar major top surface of the gate electrode lines 16, which provides a better contact than a prior art contact to planar major sidewalls of gate electrode lines (i.e., the minor edge surfaces of the gate electrode lines 16 are sidewalls rather than its top surface as in some prior art devices). This may result in a reduced contact RC and may resolve the prior art gate electrode line height variation issue, which leads to a more consistent resistance of value for the contacts.

Figure 11E:
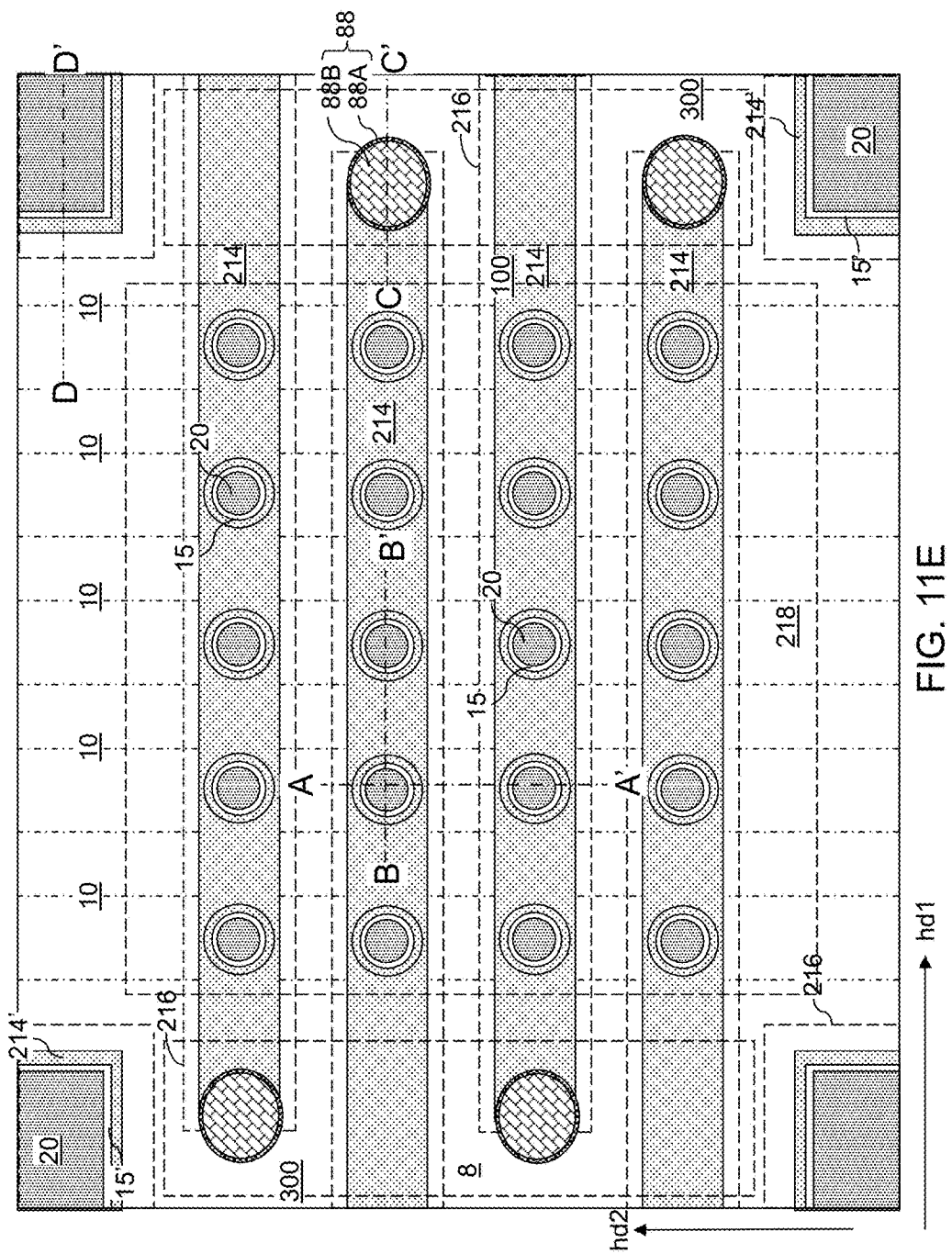
Figure 11F:
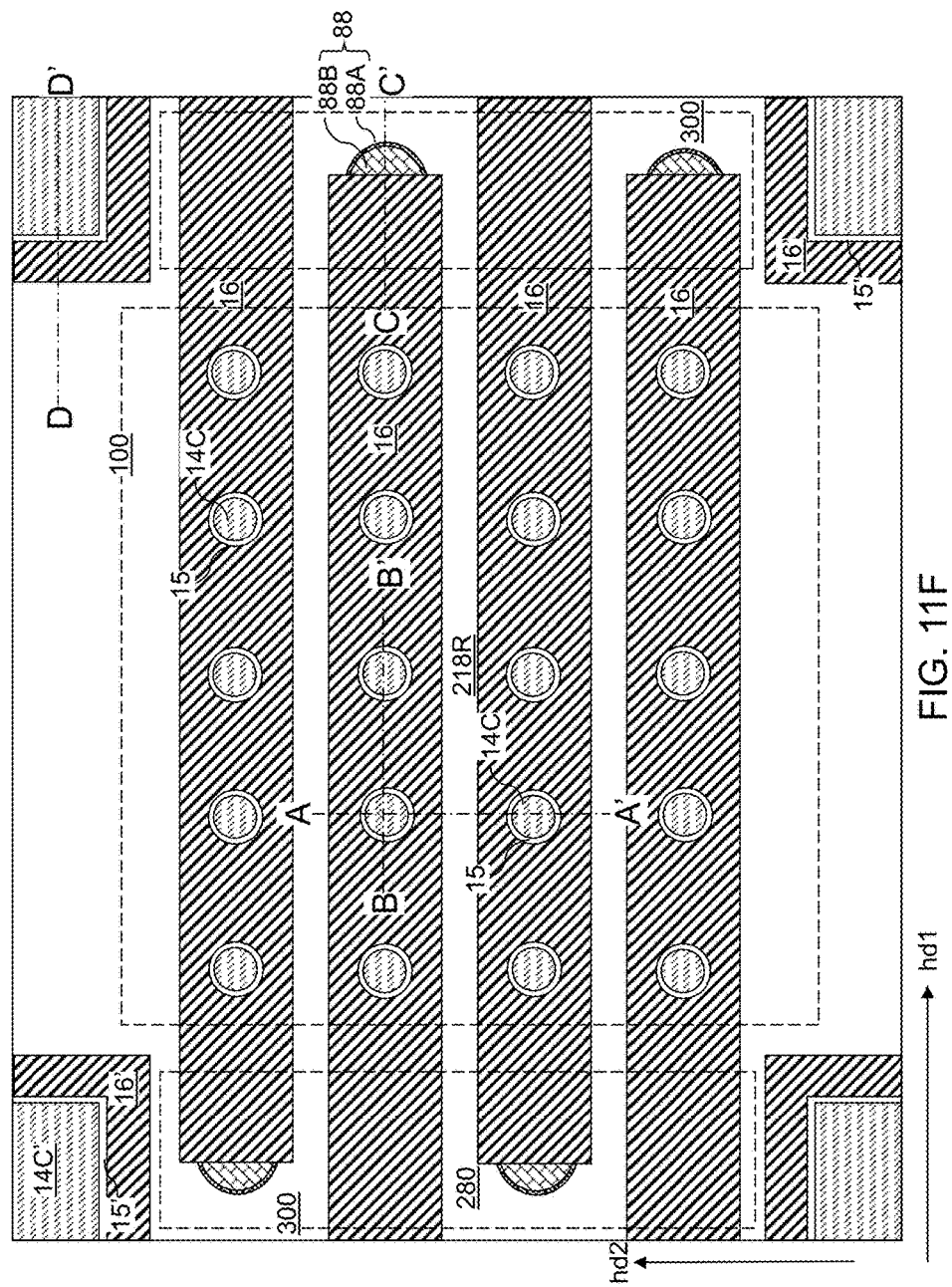
FIG. 11F is a horizontal cross-sectional view of the exemplary structure of FIGS. 11A-11E along the vertical plane F-F' of FIGS. 11A-11D.
Figure 11G:
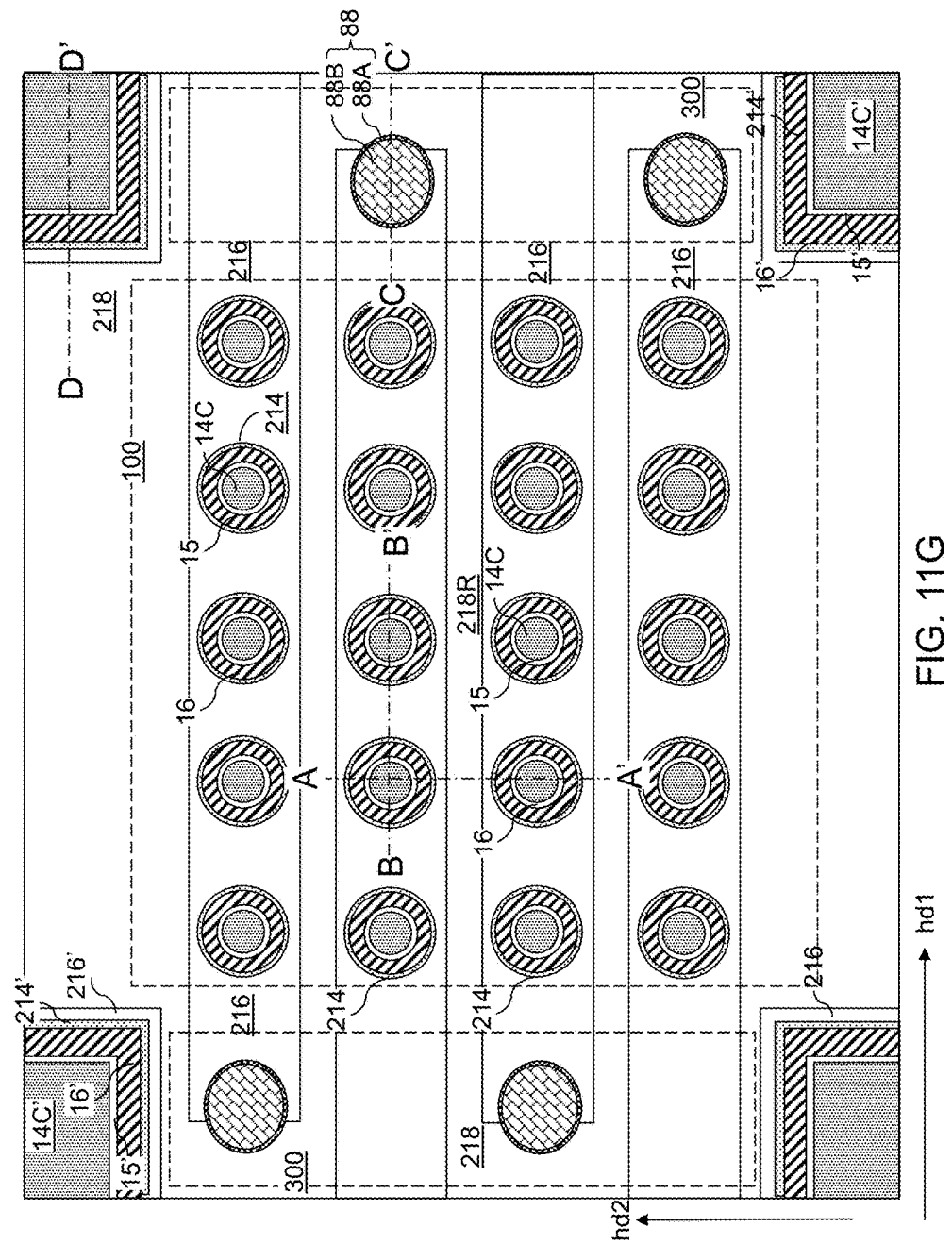
FIG. 11G is a horizontal cross-sectional view of the exemplary structure of FIGS. 11A-11E along the vertical plane G-G' of FIGS. 11A-11D.
Figure 11H:
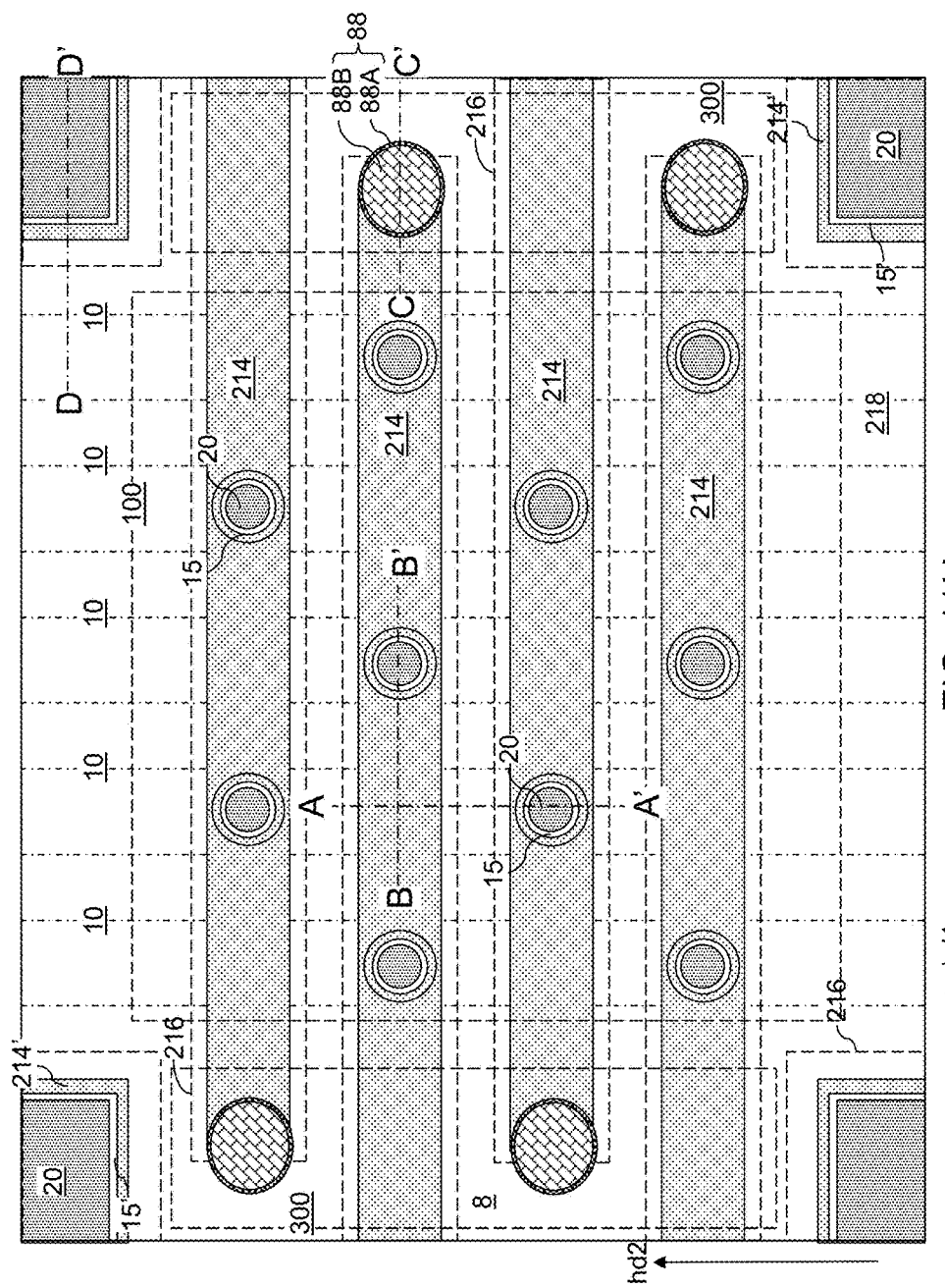
FIG. 11H is a top-down view of an alternative configuration of the exemplary structure of FIGS. 11A-11G.

Referring to FIG. 11H, an alternative configuration of the exemplary structure of FIGS. 11A-11G is illustrated, which includes semiconductor pillars (14T, 14C, 14B) at less than all of the intersections between the global bit lines 10 and the gate electrode lines 16. For example, the semiconductor pillars (14T, 14C, 14B) can be formed only at every other intersection between the global bit lines 10 and the gate electrode lines 16, similar to the layout of FIG. 3F.

Thus, vertical field effect transistors including a two-dimensional array of semiconductor pillars (14T, 14C, 14B) are formed. The semiconductor pillars (14T, 14C, 14B) are laterally spaced among one another in the second horizontal direction hd2 by dielectric rail structures 218R (i.e., vertical portions of the planarization dielectric layer 218) that extend along the first horizontal direction hd1. Each of the global bit lines 10 can be electrically connected to bottom active regions 14B (e.g., transistor source regions) of a respective row of semiconductor pillars (14T, 14C, 14B) that extends along the second horizontal direction hd2.

Figure 12:
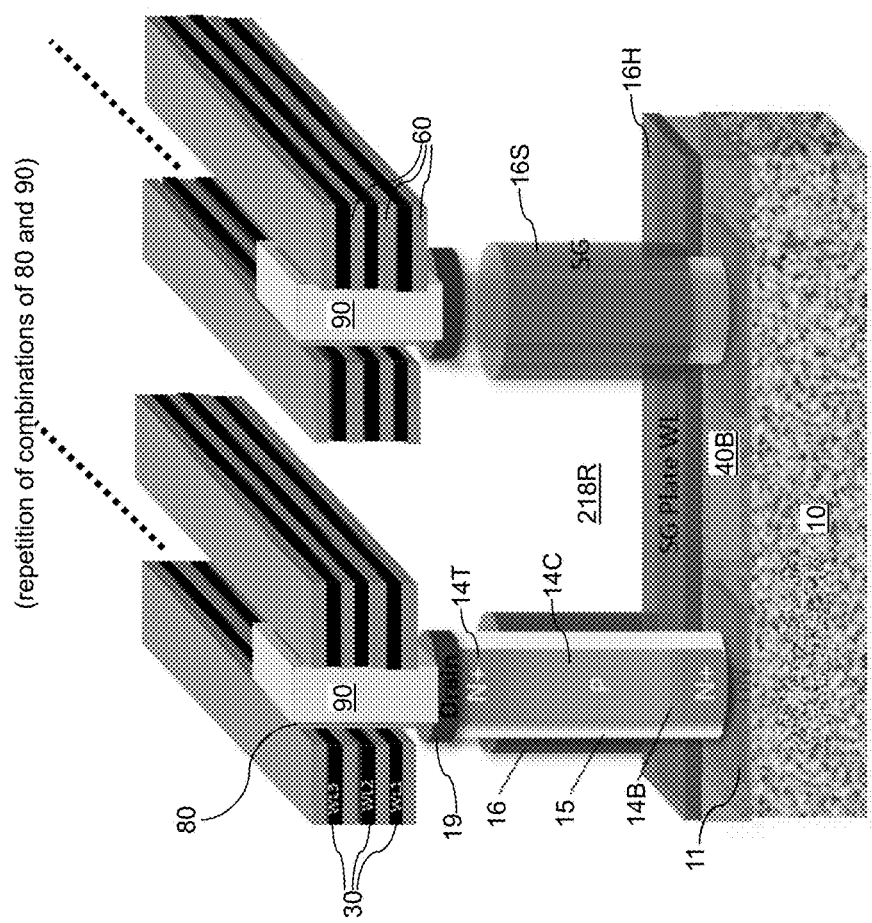
FIG. 12 is a perspective view of selected portions of the exemplary structure after formation of a three-dimensional array of memory elements and vertical bit lines according to an embodiment of the present disclosure.
Figure 13:
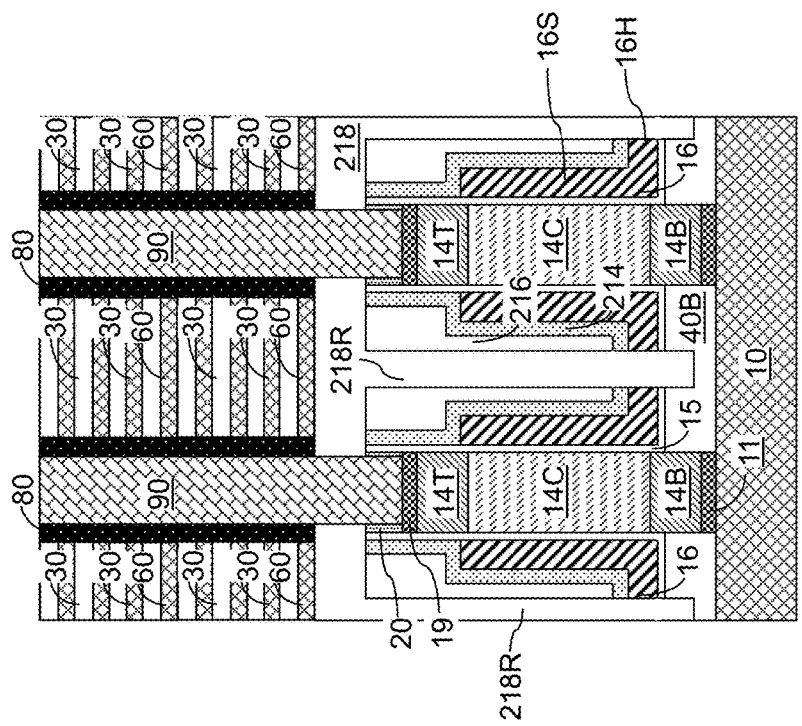
FIG. 13 is a vertical cross-sectional view of a portion of the exemplary structure after formation of the three-dimensional array of memory elements and the vertical bit lines according to an embodiment of the present disclosure.

Referring to FIGS. 12 and 13, an alternating stack of spacer material layers and insulating layers can be formed over the planarization dielectric layer 218. An alternative configuration is illustrated for the lower metal nitride portions 11 and the upper metal nitride portions 19. Some dielectric material portions are not expressly shown, and only one row of vertical field effect transistors is illustrated.

As used herein, an alternating stack of first elements and second elements refers to a structure in which instances of the first elements and instances of the second elements alternate. Each instance of the first elements that is not an end element of the alternating plurality is adjoined by two instances of the second elements on both sides, and each instance of the second elements that is not an end element of the alternating plurality is adjoined by two instances of the first elements on both ends. The first elements may have the same thickness thereamongst, or may have different thicknesses. The second elements may have the same thickness thereamongst, or may have different thicknesses. The alternating plurality of the electrically conductive layers and the insulating layers may begin with an instance of the electrically conductive layers or with an instance of the insulating layers, and may terminate with an instance of the electrically conductive layers or with an instance of the insulating layers. In one embodiment, an instance of the first elements and an instance of the second elements may form a unit that is repeated with periodicity within the alternating plurality.

The alternating stack of the electrically conductive layers and the insulating layers are patterned to form alternating layer stacks. The alternating layer stacks can be formed over the two-dimensional array of semiconductor pillars (14T, 14C, 14B). Each of the alternating layer stacks comprises a vertically alternating sequence of insulating strips 60 and electrically conductive strips 30.

In one embodiment, the electrically conductive strips 30 comprise a first electrically conductive material. In one embodiment, the first electrically conductive material can be a conductive metal nitride. In one embodiment, the first electrically conductive material can be selected from titanium nitride, tantalum nitride, titanium oxynitride in which a ratio of oxygen atoms to nitrogen atoms is less than 0.1, and tantalum oxynitride in which a ratio of oxygen atoms to nitrogen atoms is less than 0.1. Alternatively, the electrically conductive strips 30 may comprise a metal instead of or in addition to a metal nitride. In another embodiment, the electrically conductive strips 30 can include a doped semiconductor material. The insulating strips 60 may comprise any suitable insulating material, such as silicon oxide.

The thickness of each of the electrically conductive strips 30 can be in a range from 5 nm to 60 nm, although lesser and greater thicknesses can also be employed. The thickness of each of the insulating strips 60 can be in a range from 5 nm to 60 nm, although lesser and greater thicknesses can also be employed.

A pair of an electrically conductive strip 30 and an insulating strip 60 can constitute a unit of repetition in an alternating layer stack (30, 60). The total number of repetitions can be in a range from 8 to 1,024, although lesser and greater number of repetitions can also be employed. Thus, a plurality of alternating layer stacks (30, 60) of electrically conductive strips 30 and insulating strips 60 is formed over the planarization dielectric layer 218.

A two-dimensional array of via cavities can be formed by forming a row of via cavities between each vertically neighboring pair of alternating layer stacks (30, 60). For example, dielectric material rails can be formed between each neighboring pair of alternating layer stacks (30, 60), and can be patterned to form a two-dimensional array of vertical cavities in locations that overlie the vertical field effect transistors. Specifically, the planarization dielectric layer 218 and the hard mask portions 20 can be etched through underneath each vertical cavity to physically expose the top surface of a respective one of the upper metal nitride portions 19.

A memory layer stack 80 including a resistive memory material layer can be formed on the sidewalls of the vertical cavities. The memory layer stack 80 can include, from one side to another, one or more continuous resistive memory material layers and an optional steering element layer.

As used herein, a "resistive memory material" or a "reversibly resistance-switching material" is a material whose resistivity can be altered by application of an electrical bias voltage across the material. As used herein, a "resistive memory material layer" refers to a layer including a resistive memory material. As used herein, a "resistive memory element" or "resistive memory portion" refers to a portion of a resistive memory material.

The resistive memory material may be selected from: (i) a non-filamentary barrier modulated cell (BMC) which includes a barrier and an electrically conductive metal oxide whose resistivity is switched by at least one of oxygen ion and/or oxygen vacancy diffusion in response to an application of an electric field thereto; (ii) a phase change material portion providing at least two different levels of resistivity that depend on crystallinity; or (iii) a filamentary metal oxide portion (e.g., hafnium oxide layer) providing at least two different levels of resistivity depending on concentration of conductive filaments therein.

Each BMC can include a metal oxide material having at least two resistive states having different resistivity. Examples of metal oxide materials include a slightly sub-stoichiometric metal oxide such as $TiO_{2-\delta}$, $SrTiO_{3-\delta}$, $NbO_{2-\delta}$, or $Nb:SrTiO_{3-\delta}$ where value of $\delta$ can be independently selected from a range from 0 to 0.5, such as greater than zero to 0.15 (i.e., to form a sub-stoichiometric, oxygen deficient metal oxide). For example, the metal oxide material may be titanium oxide, such as sub-stoichiometric titanium oxide having less than two oxygen atoms for each titanium atom. In one embodiment, the metal oxide may have a high concentration of free electrons in thermodynamic equilibrium in a range from $1.0 \times 10^{20}/cm^3$ to $1.0 \times 10^{21}/cm^3$. The memory cell may also include a barrier material, such as amorphous silicon or other suitable barrier materials. An interfacial barrier oxide is located between the metal oxide material and the barrier material. For an amorphous silicon barrier material, the interfacial barrier oxide may comprise silicon oxide. Without wishing to be bound by a particular theory, it is believed that the BMC ReRAM device operates as follows. The switching mechanism in BMC stack is generally understood as oxygen interstitial (Oi) generation in the interfacial barrier oxide (e.g., $SiO_2$) at the amorphous silicon (a-Si)/$TiO_{2-\delta}$ interface after a RESET operation (i.e., resetting the stack into the high resistivity state, HRS). The oxygen interstitials may drift into defect rich $TiO_{2-\delta}$ where they cause a re-oxidation of the $TiO_{2-\delta}$ (e.g., recombine with oxygen vacancies in the $TiO_{2-\delta}$ near the interface. This re-oxidation decreases the conductivity of the $TiO_{2-\delta}$ material and/or increases the thickness of the insulating interfacial barrier oxide and hence increases the resistance of the BMC memory cell. During the SET operation, opposite voltage is applied across the cell, and Ti—O bonds are supposed to be broken down to generate Oi and Vo (oxygen vacancy) pair in the titanium oxide layer. Oi may drift back to the a-Si/$TiO_{2-\delta}$ interface along the electric field to increase the conductivity of the $TiO_{2-\delta}$ layer and/or decrease the thickness of the insulating interfacial barrier oxide and hence decrease the resistance of the BMC memory cell to set the memory cell into the low resistivity state, LRS. Without wishing to be bound by a particular theory, it is believed that a BMC ReRAM device of the embodiments of the present disclosure may operate based on the principle described above and/or based on an alternative principle instead of or in addition to the principle described above. For example, the BMC ReRAM device may operate by modulation of energy band structure within the cell. When the charge carrier density is modulated, the resistance of the cell is changed. In other words, the resistance of the memory cell may be modulated by changes in the band structure and consequent changes in the charge distribution instead of or in addition to the change in thickness of the interfacial barrier oxide.

As used herein, a "steering element" refers to an element, such as a diode, that provides a non-linear current-voltage characteristic for electrical current passing therethrough. In one embodiment, the steering element may have an asymmetric current-voltage characteristic (e.g., a diode which conducts current primarily in one direction (asymmetric conductance) and which has a lower resistance to the flow of current in one direction, and a higher resistance in the other direction). As used herein, a "steering element layer" refers to a layer including at least one steering element.

An anisotropic etch can be performed to remove horizontal portions of the memory layer stack 80. Each memory layer stack 80 includes a vertical stack of resistive elements as embodied portions of a continuous resistive memory material layer located at levels of the electrically conductive strips 30. By forming a two-dimensional array of memory layer stacks 80, a three-dimensional array of memory elements can be formed.

A top surface of the underlying upper metal nitride portion 19 can be physically exposed underneath a cavity inside each memory layer stack 80. At least one conductive material (such as a doped semiconductor material and/or a metallic nitride material) can be deposited in the cavities to form vertical bit lines (e.g., local bit lines) 90. Vertical stacks of resistive memory elements are formed between neighboring pairs of alternating layer stacks (30, 60) to provide a three-dimensional memory element array. Vertical bit lines 90 are formed inside the vertical stacks of resistive memory elements. Each of the vertical bit lines 90 is electrically connected to a respective one of the top active regions 14T through a respective upper metal nitride portion 19. Each of the vertical bit lines 90 is laterally surrounded by a respective continuous resistive memory material layer that vertically extends from a bottommost one of the electrically conductive strips 30 to a topmost one of the electrically conductive strips 30. Portions of each continuous resistive memory material layer located at levels of the electrically conductive strips 30 constitute a respective vertical stack of resistive memory elements.

Alternatively, the memory layer stack 80 can be formed on the sidewalls of the alternating layer stacks (30, 60), and a conductive material can be deposited to form conductive rail structures. The memory layer stacks 80 and the conductive rail structures can be divided into multiple portions, for example, by lithographic patterning and an anisotropic etch. A combination of a pair of memory layer stacks 80 (as divided into discrete portions) and a vertical bit line 90 (which is a remaining portion of the conductive rail structures) can be arranged in a two-dimensional array to provide a three-dimensional array of resistive memory elements.

The various embodiments of the present disclosure can include a resistive memory device. The resistive memory device can comprise a two-dimensional array of vertical field effect transistors located over a substrate 6 and including a two-dimensional array of semiconductor pillars (14T, 14C, 14B), gate electrode lines 16 laterally extending along a first horizontal direction hd1 and spaced apart along a second horizontal direction hd2, and gate dielectric layers 15 located between the gate electrode lines 16 and the two-dimensional array of semiconductor pillars (14T, 14C, 14B). Each of the semiconductor pillars (14T, 14C, 14B) comprises a bottom active region 14B, a channel region 14C, and a top active region 14T.

A two-dimensional array of vertical bit lines 90 is electrically connected to a respective one of the top active regions 14T. Alternating layer stacks (30, 60) are located between neighboring rows of the vertical bit lines 90. Each of the alternating layer stacks comprises a vertically alternating sequence of insulating strips 60 and electrically conductive word line strips 30. A vertical stack of memory elements 80 is located between each of the vertical bit lines 90 and alternating layer stacks (30, 60) to provide a three-dimensional memory element array.

As shown in FIGS. 12 and 13, each of the gate electrode lines 16 comprises a plurality of surrounding portions 16S that laterally surround a respective entire one of the channel regions 14C. Each surrounding portion 16S functions as a gate electrode of a respective vertical select field effect transistor. Each of the gate electrode lines 16 also comprises a horizontal layer portion 16H adjoined to a plurality of surrounding portions 16S.

In one embodiment, the horizontal layer portion 16H of each gate electrode line 16 has a same composition, and a same thickness, as the plurality of cylindrical portions. In one embodiment, the horizontal layer portion 16H of each gate electrode liner 16 has a width that is greater than a maximum lateral dimension (such as the diameter or the major axis) of each of the plurality of surrounding portions 16S that is measured along the second horizontal direction hd2. If the semiconductor pillars (14T, 14C, 14B) are cylindrical, then the surrounding portions 16S are also cylindrical. In one embodiment, the semiconductor pillars (14T, 14C, 14B) vertically extend through openings in each horizontal layer portion 16H of the gate electrode lines 16.

In one embodiment, the resistive memory device can further comprise an isolation dielectric layer contacting, and laterally surrounding, each bottom active region of the semiconductor pedestals, wherein each of the gate dielectric layers contacts a top surface of the isolation dielectric layer, and wherein each of the gate electrode lines overlies the isolation dielectric layer. In one embodiment, the resistive memory device further comprises dielectric spacers 216 laterally extending along the first horizontal direction hd1 and laterally surrounding a respective row of semiconductor pillars (14T, 14C, 14B) arranged along the first horizontal direction hd1, wherein sidewalls of the dielectric spacers 216 that extend along the first horizontal direction hd1 are vertically coincident with sidewalls of a respective underlying gate electrode line 16. In one embodiment, the resistive memory device can further comprise a dielectric liners 214 located over the gate electrode lines 16 and a dielectric fill material portion 218 including a horizontal portion overlying the dielectric spacers 216 and a plurality of vertical portions that protrude downward from the horizontal portion between each neighboring pair of dielectric spacers 216.

In one embodiment, the resistive memory device further comprises gate contact via structures 88 comprising a conductive material and contacting a top surface and a sidewall of a respective horizontal layer portion 16H of one of the gate electrode lines 16. In one embodiment, each of the gate contact via structures 88 comprises an upper portion having a bottom surface that contacts the top surface of the respective horizontal layer portion 16H of one of the gate electrode lines 16 and further comprises a lower portion having a sidewall that is vertically coincident with the sidewall of the respective one of the gate electrode lines 16, wherein the lower portion vertically extends below a horizontal plane including bottom surfaces of the gate electrode lines 16 and contacts a top surface of an underlying conductive structure 110.

In one embodiment, each of the vertical bit lines 90 is located adjacent to a respective continuous resistive memory material layer (a layer within the memory layer stack 80) that vertically extends from a bottommost one of the electrically conductive strips 30 to a topmost one of the electrically conductive strips 30, wherein portions of each continuous resistive memory material layer located at levels of the electrically conductive strips 30 constitute a respective vertical stack of resistive memory elements. In one embodiment, the resistive memory device further comprises a one-dimensional array of global bit lines 10 electrically connected to bottom active regions 10B of a respective row of semiconductor pillars (14T, 14C, 14B) that extends along the second horizontal direction hd2.

The various embodiments of the present disclosure can be employed to provide a two-dimensional array of vertical field effect transistors in an all surrounding gate (ASG) configuration. All surrounding gate vertical field effect transistors provide superior channel control compared to dual gate configurations or trigate configurations because the electrical field is applied from all lateral sides of a channel. Further, because a single anisotropic etch process is employed to define the shape of the semiconductor pillars (14T, 14C, 14B) having vertical sidewalls, and formation of any concave or convex sidewalls of semiconductor pillars is avoided. This may improve the on current of the transistor by over one and a half times.

Although the foregoing refers to particular preferred embodiments, it will be understood that the disclosure is not so limited. It will occur to those of ordinary skill in the art that various modifications may be made to the disclosed embodiments and that such modifications are intended to be within the scope of the disclosure. Where an embodiment employing a particular structure and/or configuration is illustrated in the present disclosure, it is understood that the present disclosure may be practiced with any other compatible structures and/or configurations that are functionally equivalent provided that such substitutions are not explicitly forbidden or otherwise known to be impossible to one of ordinary skill in the art. All of the publications, patent applications and patents cited herein are incorporated herein by reference in their entirety.

What is claimed is:

1. A memory device, comprising:
a two-dimensional array of vertical field effect transistors located over a substrate and including a two-dimensional array of semiconductor pillars, gate electrode lines laterally extending along a first horizontal direction and spaced apart along a second horizontal direction, and gate dielectrics located between the gate electrode lines and the two-dimensional array of semiconductor pillars, wherein each of the semiconductor pillars comprises a bottom active region, a channel region, and a top active region, and wherein each of the gate electrode lines comprises a plurality of surrounding portions that entirely laterally surround a respective one of the channel regions;
a two-dimensional array of vertical bit lines electrically connected to a respective one of the top active regions;
alternating layer stacks located between neighboring rows of the vertical bit lines, wherein each of the alternating layer stacks comprises a vertically alternating sequence of insulating strips and electrically conductive word line strips; and
a vertical stack of memory elements located between each of the vertical bit lines and alternating layer stacks to provide a three-dimensional memory element array;
wherein:
each of the gate electrode lines further comprises a horizontal layer portion adjoined to a plurality of surrounding portions;
the horizontal layer portion has a same composition, and a same thickness, as the plurality of surrounding portions;
the semiconductor pillars are cylindrical;
the surrounding portions are cylindrical; and
the horizontal layer portion has a width that is greater than a maximum lateral dimension of each of the plurality of cylindrical surrounding portions along the second horizontal direction.

2. The memory device of claim 1, wherein the semiconductor pillars vertically extend through openings in each horizontal layer portion.

3. The memory device of claim 1, further comprising an isolation dielectric layer contacting, and laterally surrounding, each bottom active region of the semiconductor pedestals, wherein each of the gate dielectrics contacts a top surface of the isolation dielectric layer, and wherein each of the gate electrode lines overlies the isolation dielectric layer.

4. The memory device of claim 3, further comprising dielectric spacers laterally extending along the first horizontal direction and laterally surrounding a respective row of semiconductor pillars arranged along the first horizontal direction, wherein sidewalls of the dielectric spacers that extend along the first horizontal direction are vertically coincident with sidewalls of a respective underlying gate electrode line.

5. The memory device of claim 4, further comprising:
dielectric liners located over the gate electrode lines; and
a dielectric fill material portion including a horizontal portion overlying the dielectric spacers and a plurality of vertical portions that protrude downward from the horizontal portion between each neighboring pair of dielectric spacers.

6. The memory device of claim 1, further comprising gate contact via structures comprising a conductive material and contacting a top surface of the horizontal layer portions.

7. The memory device of claim 6, wherein:
each of the gate contact via structures further contacts a sidewall of a respective one of the gate electrode lines; and
each of the gate contact via structures comprises an upper portion having a bottom surface that contacts the top surface of the respective horizontal layer portions and further comprises a lower portion having a sidewall that is vertically coincident with the sidewall of the respective one of the gate electrode lines, wherein the lower portion vertically extends below a horizontal plane including bottom surfaces of the gate electrode lines and contacts a top surface of an underlying conductive structure.

8. The memory device of claim 1, wherein:
each of the vertical bit lines is located adjacent to a respective continuous resistive memory material layer that vertically extends from a bottommost one of the electrically conductive word line strips to a topmost one of the electrically conductive word line strips; and
portions of each continuous resistive memory material layer located at levels of the electrically conductive word line strips constitute a respective vertical stack of resistive memory elements.

9. The memory device of claim 1, further comprising a one-dimensional array of global bit lines electrically connected to bottom active regions of a respective row of semiconductor pillars that extends along the second horizontal direction.

* * * * *